(12) United States Patent
Crawley et al.

(10) Patent No.: US 7,923,710 B2
(45) Date of Patent: Apr. 12, 2011

(54) DIGITAL ISOLATOR WITH COMMUNICATION ACROSS AN ISOLATION BARRIER

(75) Inventors: Philip John Crawley, Sacramento, CA (US); Sajol Ghoshal, El Dorado Hills, CA (US); John R. Camagna, El Dorado Hills, CA (US)

(73) Assignee: Akros Silicon Inc., Folsom, CA (US)

( * ) Notice: Subject to any disclaimer, the term of this patent is extended or adjusted under 35 U.S.C. 154(b) by 1069 days.

(21) Appl. No.: 11/683,985

(22) Filed: Mar. 8, 2007

(65) Prior Publication Data

US 2008/0218258 A1 Sep. 11, 2008

(51) Int. Cl.
H03F 3/38 (2006.01)
(52) U.S. Cl. .................. 250/551; 375/316; 375/244
(58) Field of Classification Search .............. 250/551; 375/316, 244
See application file for complete search history.

(56) References Cited

U.S. PATENT DOCUMENTS

| | | | |
|---|---|---|---|
| 4,748,419 A | 5/1988 | Somerville | |
| 4,757,528 A | 7/1988 | Falater et al. | |
| 5,051,601 A * | 9/1991 | Atobe et al. | 250/551 |
| 5,298,800 A * | 3/1994 | Dunlop et al. | 250/551 |
| 5,701,037 A | 12/1997 | Weber et al. | |
| 5,818,112 A | 10/1998 | Weber et al. | |
| 5,870,046 A | 2/1999 | Scott et al. | |
| 5,952,849 A | 9/1999 | Haigh | |
| 6,107,948 A | 8/2000 | Scott et al. | |
| 6,124,756 A | 9/2000 | Yaklin et al. | |
| 6,137,827 A | 10/2000 | Scott et al. | |
| 6,147,542 A | 11/2000 | Yaklin | |
| 6,182,172 B1 | 1/2001 | Schwan | |
| 6,191,717 B1 | 2/2001 | Scott et al. | |
| 6,225,927 B1 | 5/2001 | Scott et al. | |
| 6,249,171 B1 | 6/2001 | Yaklin et al. | |
| 6,297,755 B2 | 10/2001 | Scott et al. | |
| 6,389,061 B1 | 5/2002 | Scott et al. | |
| 6,407,432 B1 | 6/2002 | Nemoto et al. | |
| 6,430,229 B1 | 8/2002 | Scott et al. | |
| 6,525,566 B2 | 2/2003 | Haigh et al. | |
| 6,570,513 B2 | 5/2003 | Scott et al. | |
| 6,603,807 B1 | 8/2003 | Yukutake et al. | |
| 6,611,553 B1 | 8/2003 | Scott et al. | |
| 6,683,548 B2 | 1/2004 | Scott et al. | |
| 7,064,442 B1 | 6/2006 | Lane et al. | |
| 7,075,329 B2 | 7/2006 | Chen et al. | |
| 7,088,803 B2 | 8/2006 | Rahamim et al. | |
| 7,089,475 B1 | 8/2006 | Krone et al. | |
| 7,154,940 B2 | 12/2006 | Scott et al. | |
| 2005/0152080 A1 | 7/2005 | Harris et al. | |
| 2005/0167756 A1 | 8/2005 | Lotfi et al. | |
| 2005/0168203 A1 | 8/2005 | Dwarakanath et al. | |
| 2005/0169024 A1 | 8/2005 | Dwarakanath et al. | |
| 2005/0243496 A1 | 11/2005 | Harris | |
| 2005/0269657 A1 | 12/2005 | Dupuis | |

(Continued)

Primary Examiner — Seung C Sohn
(74) Attorney, Agent, or Firm — Ken J. Koestner

(57) ABSTRACT

A signal isolator comprises an isolation barrier, a transmitter, a differentiator, and a recovery circuit. The transmitter is coupled to a first side of the isolation barrier and is configured to receive and convert an information signal to a differential signal that encodes information in the information signal in a single transition edge. The differentiator is coupled to a second side that is isolated from the first side of the isolation barrier and differentiates the differential signal. The recovery circuit is coupled to the differentiator and operates to recover an output information signal based on the information in the single transition edge.

50 Claims, 19 Drawing Sheets

U.S. PATENT DOCUMENTS

| | | |
|---|---|---|
| 2005/0271147 A1 | 12/2005 | Dupuis |
| 2005/0271148 A1 | 12/2005 | Dupuis |
| 2005/0271149 A1 | 12/2005 | Dupuis |
| 2005/0272378 A1 | 12/2005 | Dupuis |
| 2005/0288799 A1 | 12/2005 | Brewer et al. |
| 2006/0098363 A1 | 5/2006 | Hebert et al. |
| 2006/0098364 A1 | 5/2006 | Harris et al. |
| 2006/0098373 A1 | 5/2006 | Hebert et al. |
| 2006/0176638 A1 | 8/2006 | Coates |

* cited by examiner

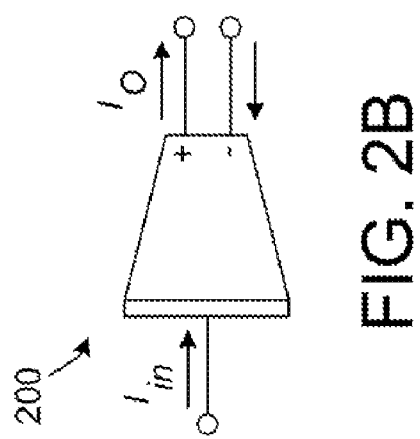
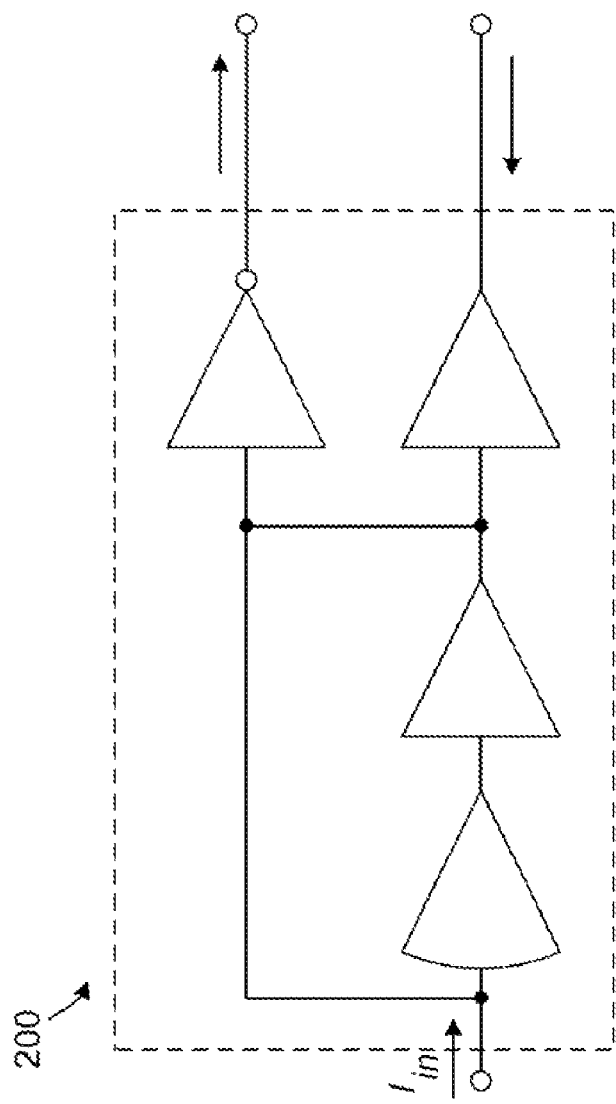
FIG. 2B
FIG. 2A

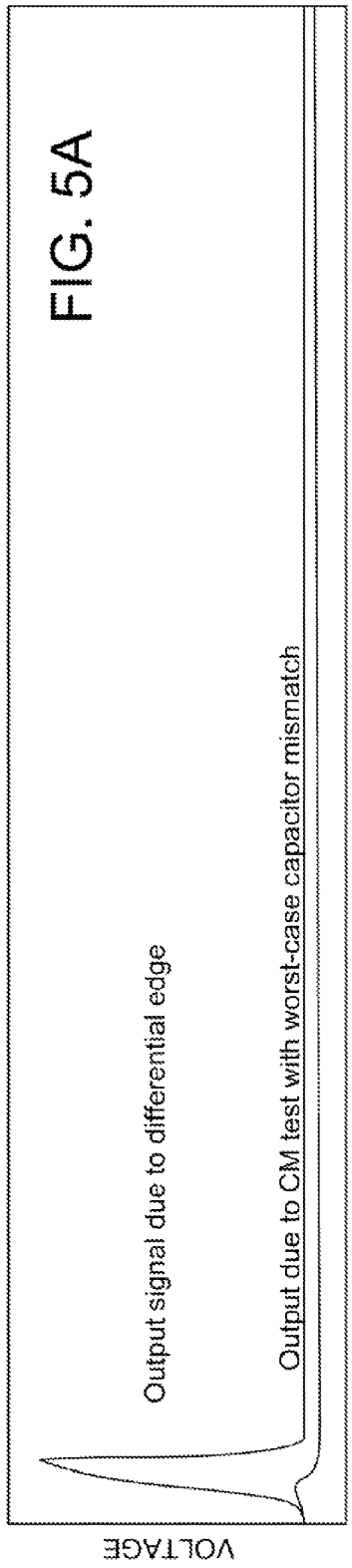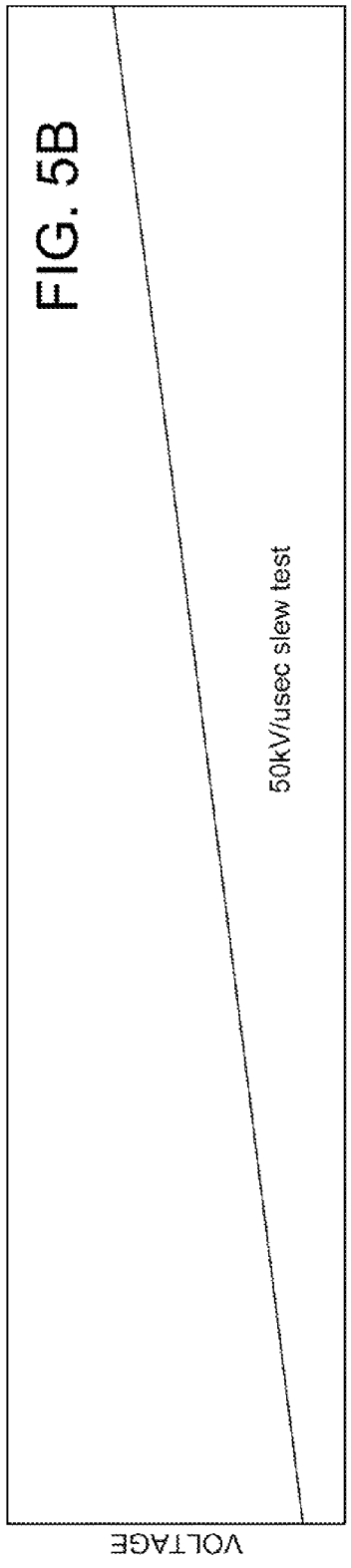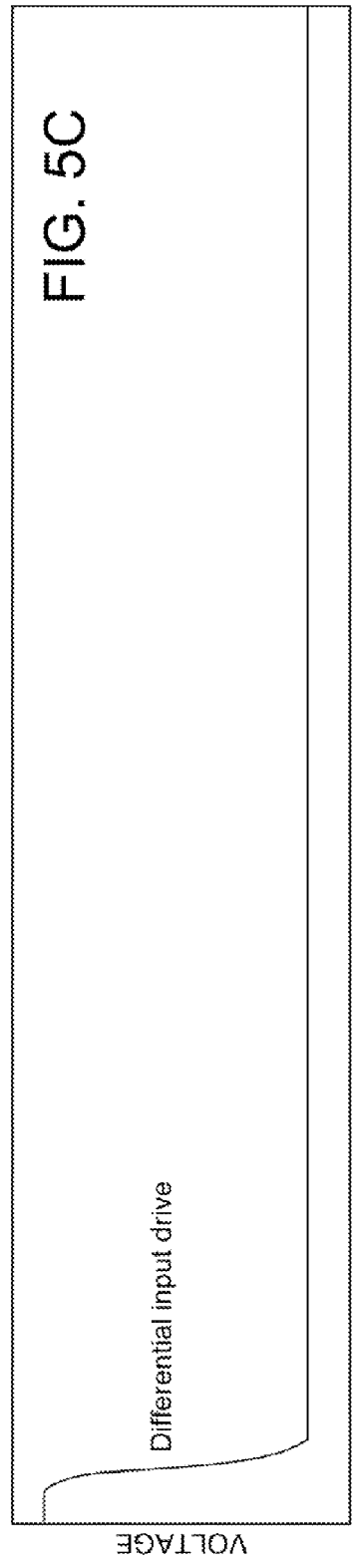

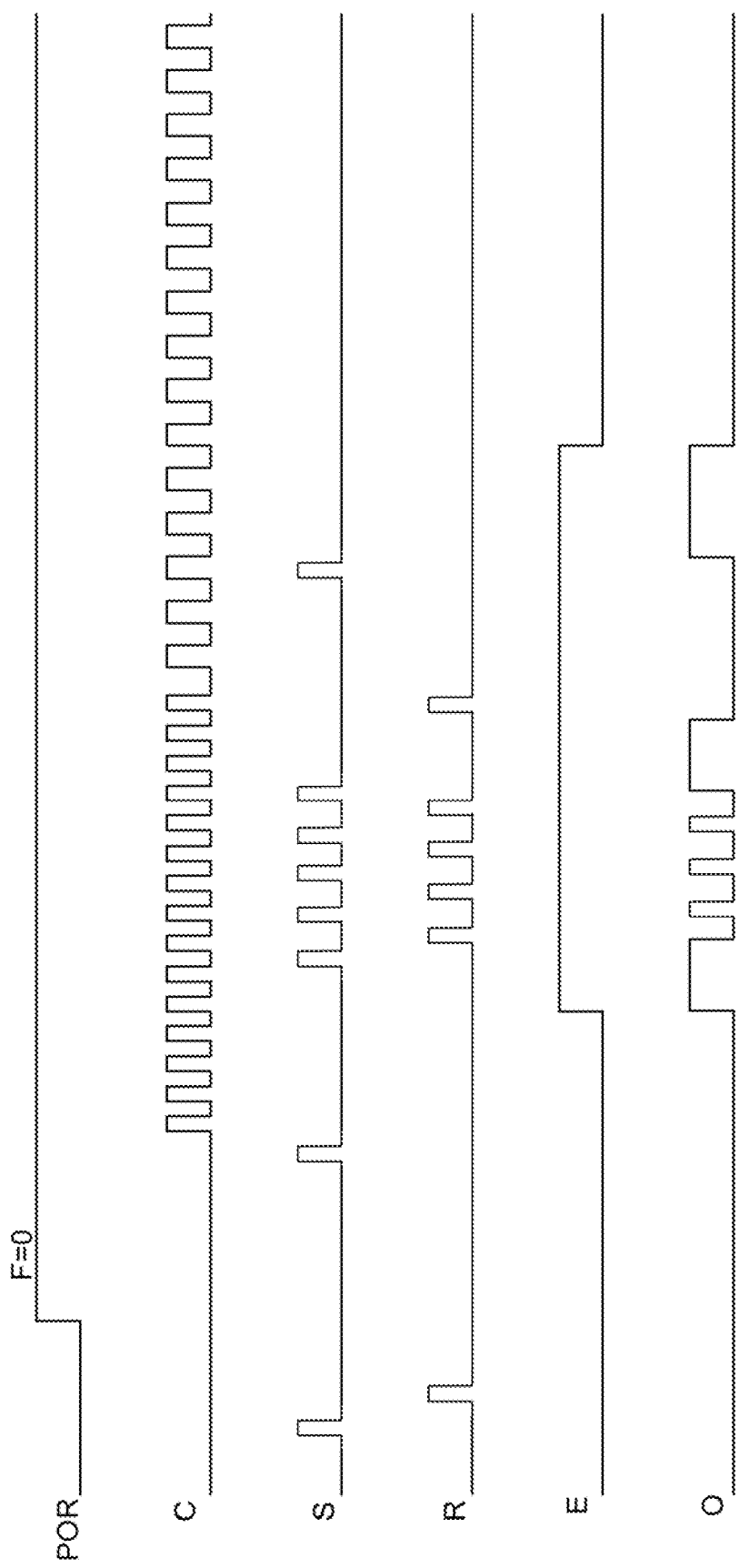

DIGITAL ISOLATOR WITH COMMUNICATION ACROSS AN ISOLATION BARRIER

BACKGROUND

Various communications, medical, computing, industrial, and other systems implement isolation barriers to electrically isolate sections of electronic circuitry. An isolator is a device that can transfer a signal between sections of electronic circuitry while maintaining electrical isolation between the sections.

A typical conventional design attains isolation, for example, by connecting to a communication channel through a transformer. The transformer provides isolation both for surge and galvanic isolation. Power can be transmitted on the line through the transformer.

SUMMARY

According to an embodiment of a communication system, a signal isolator comprises an isolation barrier, a transmitter, a differentiator, and a recovery circuit. The transmitter is coupled to a first side of the isolation barrier and is configured to receive and convert an information signal to a differential signal that encodes information in the information signal in a single transition edge. The differentiator is coupled to a second side that is isolated from the first side of the isolation barrier and differentiates the differential signal. The recovery circuit is coupled to the differentiator and operates to recover an output information signal based on the information in the single transition edge.

BRIEF DESCRIPTION OF THE DRAWINGS

Embodiments of the invention relating to both structure and method of operation may best be understood by referring to the following description and accompanying drawings;

FIGS. 2A and 2B respectively show a schematic circuit diagram and associated system which respectively illustrate an embodiment of a current-mode differentiator that can be implemented in various implementations of a signal isolator;

FIGS. 5A, 5B, and 5C are a set of time waveform algorithms illustrating aspects of operation of a first differentiator output signal;

FIGS. 10A and 10B are, respectively, a state diagram and an associated set of time waveforms illustrating an embodiment of operation of the state machine and failsafe logic for managing channels in the signal isolator.

DETAILED DESCRIPTION

Figure 1A:
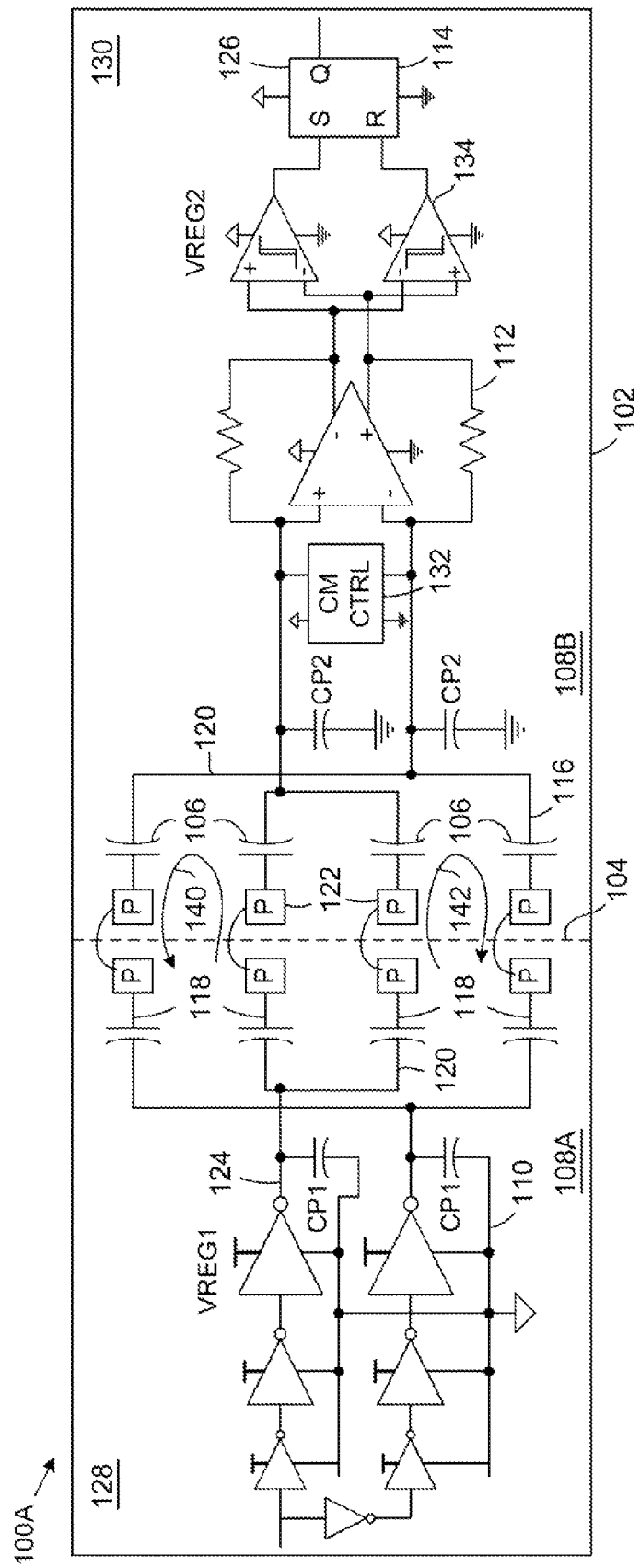
FIG. 1A is a schematic circuit diagram depicting an embodiment of a signal isolator that is configured as a digital isolator with capacitors arranged to create magnetic and electrical differentiality.

Referring to FIG. 1A, a schematic circuit diagram illustrates an embodiment of a signal isolator 100A that is configured as a digital isolator with capacitors arranged to create magnetic and electrical differentiality. The signal isolator 100A comprises an integrated circuit substrate 102 and an isolation barrier 104 formed by two or more interlayer metal dielectric capacitors 106 that isolate a first domain 108A from a second domain 108B in the substrate 102. A transmitter 110 in the first domain 108A is configured to transmit an information signal through the isolation barrier 104. A differentiator 112 in the second domain 108B is configured to differentiate the transmitted information signal. A feedback device 114 in the second domain 108A is coupled to the differentiator 112 and is used to recover an output information signal based on the differentiated information signal.

The feedback device 114 can be configured to recover the output information signal using positive feedback.

The isolation barrier 104 can form a differential transmission pathway 116 made up of multiple differential lines 118 each having parallel capacitive pathways 120 configured to create magnetic and electrical differentiality. For example, by dividing the capacitors 106 into multiple units, such as four units as shown, magnetic and electrical differentiality can be attained.

In the illustrative embodiment, the differential transmission pathway 116 can have first and second differential lines 118. Each differential line 118 can have two parallel pathways 120 with each pathway including first and second capacitors 106 coupled at a bond pad 122.

The bond pads 122 can be arranged in positions that attain first-order common-centroiding of the capacitors 106, thereby removing distance effects. In an illustrative embodiment first-order common-centroiding of the capacitors 106 can attain a suitable improvement, for example on the order of 20 dB or other suitable improvement.

In the illustrative example, four capacitors 106 and associated bond wires are placed in a physical configuration whereby the differential current flow in the loops 140 and 142 are in balance to the first order and generate magnetic fields that cancel, creating a magnetic dipole with greatly reduced far-fields. The same principle also enables the device to reject magnetic interference so that the circuit attains a magnetically differential characteristic.

Figure 1B:
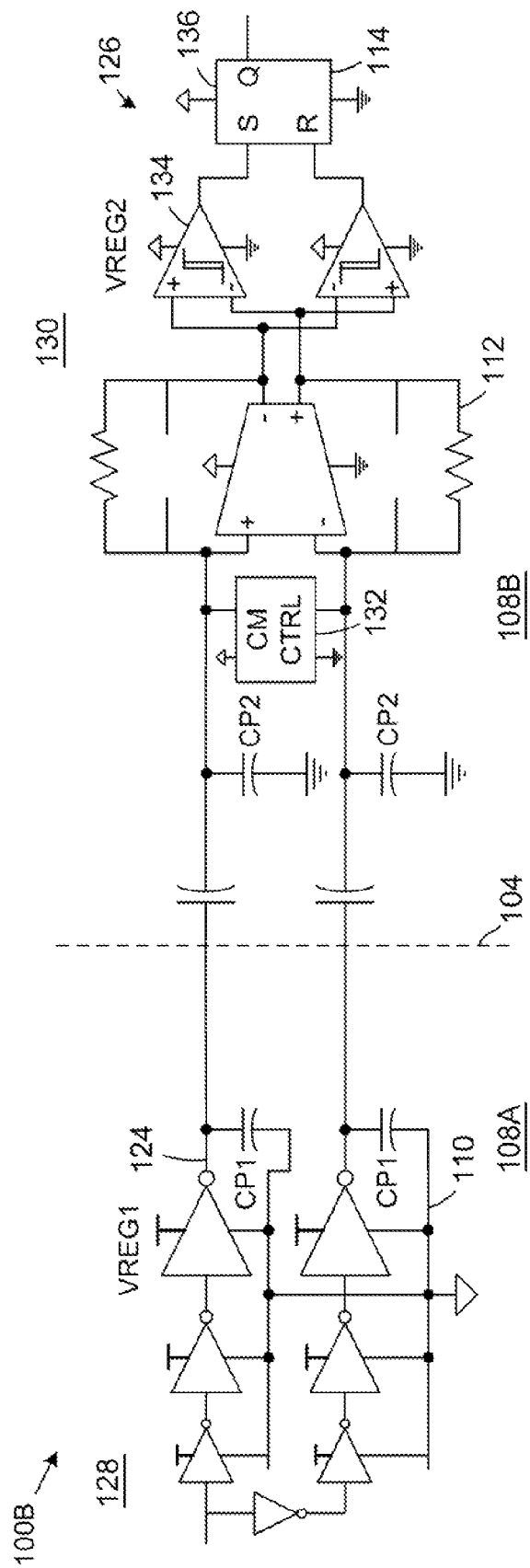
FIG. 1B is a schematic circuit diagram illustrating another embodiment of a signal isolator that is configured as a digital isolator with an isolation capacitor on one die.

In various embodiments, the isolation barrier 104 can be configured in any suitable arrangement such as two or more interlayer metal dielectric capacitors 106 formed in the first domain 108A and two or more interlayer metal dielectric capacitors 106 formed in the second domain 108B. In another arrangement, the two or more interlayer metal dielectric capacitors 106 can be formed partly in the first domain 108A and partly in the second domain 108B. Also, the two or more interlayer metal dielectric capacitors 106 can be formed between the first 108A and second 108B domains. Furthermore, the interlayer metal dielectric capacitors 106 can be formed partly in the first domain 108A, partly in the second domain 108B, and partly between the first and second domains. Also, the isolation barrier 104 can be constructed completely in one domain as illustrated in FIG. 1B.

The differentiator 112 separates a common-mode to differential component from true differential components. Common mode suppression element 132 can be used to maintain the differentiator 112 is linear range.

The differentiator 112 is shown with resistive feedback and connected to the common mode control element 132. In some embodiments, the common mode control element 132 can be omitted through usage of common mode techniques in configuring the differentiator. As long as common mode feedback is maintained, low impedance input is inherent, enabling elimination of the common mode control element 132. Other designs can include multiple differentiators coupled in series to form a low impedance input, condition to the receiving side of the isolation barrier. Accordingly, several techniques can be used to implement a differentiator that forms a low impedance input condition which is desirable for usage with capacitors, as opposed to inductors.

In some embodiments, the differentiator 112 can be configured as a current mode differentiator.

In accordance with another embodiment of a signal isolator 100A, also as depicted in FIG. 1A, can comprise an isolation barrier 104 isolating first 108A and second 108B domain, a modulator 124, a differentiator 112, and a recovery circuit 126. The modulator 124 is in the first domain 108A and coupled to the isolation barrier 104. The modulator 124 can be configured to convert an information signal to a digital signal that contains all information in the information signal in an edge of a single transition and passes the digital signal across the isolation barrier 104 to the second domain 108B. The differentiator 112 is positioned in the second domain 108B and is also coupled to the isolation barrier 104. The differentiator 112 differentiates the passed digital signal. The recovery circuit 126 is also located in the second domain 108B coupled to the differentiator 112. The recovery circuit 126 is configured to recover an output information signal from the differentiated digital signal based on the information in the single transition edge.

The recovery circuit 126 can comprise a comparator 134 coupled to the differentiator 112 and a feedback device 114 coupled to the comparator 134. The comparator 134 accesses data out of the differentiator 112 based on a reference level that may be fixed or the output signal from a peak detector.

In various implementations, modulation can be implemented in a variety of different ways, including but not limited to pulse width modulation (PWM), delta modulation (DM), frequency modulation (FM), phase modulation, and others.

In an illustrative example implementation, a powered system 128 can be formed in the first domain 108A and an isolated system 130 in the second domain 108A.

The illustrative signal isolator 100A has a channel formed by the transmitter 110 that passes a single signal to the modulator 124 which operates as a differential receiver.

Referring to FIG. 1B, a schematic circuit diagram illustrates an embodiment of a signal isolator 100B that is configured as a digital isolator with an isolation capacitor on one die. The illustrative signal isolator 100B comprises an isolation barrier 104, a transmitter 110, a differentiator 112, and a feedback device 114. The transmitter 110 is coupled to a first side 108A of the isolation barrier and is configured to receive and convert an information signal to a differential signal that encodes information in the information signal in a single transition edge. The differentiator 112 is coupled to a second side 108B of the isolation barrier 104 which is isolated from the first side 108A of the isolation barrier 104. The differentiator 112 differentiates the differential signal. The feedback device 114 is coupled to the differentiator 112 and configured to recover an output information signal based on the information in the single transition edge.

The signal isolator 100B, as depicted, can be implemented with all isolation on a single die. In various embodiments, a signal isolator can be implemented in which the first and second dies are not on the same wafer, or even from the same process. For example, in some arrangements the transmitter can be formed on a high-voltage process that is different from the process of the receiver side of the isolator.

The feedback device 114 can be configured to recover the output information signal using positive feedback.

In some embodiments, the differentiator 112 can be configured to separate a common-mode-to-differential signal component, which can result for example from mismatch of capacitors 106, from true differential signal components. For example, the differentiator 112 can be configured as a current mode differentiator.

A common mode suppression control circuit 132 can be coupled to the differentiator 112 and configured to maintain the differentiator 112 in a linear range.

In accordance with another embodiment of a signal isolator 100B, also as depicted in FIG. 1B, can comprise an isolation barrier 104, a modulator 124, a differentiator 112, and a recovery circuit 126. The modulator 124 is coupled to an input side 108A of the isolation barrier 104 and can receive a logic signal with first and second transition edges that shift the logic signal between two states. The modulator 124 converts the logic signal to a differential signal and passes the differential signal across the isolation barrier 104. The differentiator 112 is coupled to an output side 108B of the isolation barrier 104 and functions to differentiate the communicated differential signal. The recovery circuit 126 is coupled to the differentiator 112 and recovers a signal indicative of the first and second transition edges from the differentiated signal.

The recovery circuit 126 can be configured to recover the output information signal using positive feedback.

The modulator 124 can be implemented to create the differential signals that contain all information in the logic signals in a single transition edge. In a particular embodiment, the modulator 124 can be implemented as a differential comparator.

A differential comparator 134 can be coupled to a set/reset latch 136 to form the recovery circuit 126.

A powered system 128 can be constructed on the input side 108A of the isolation barrier 104 and an isolated system 130 can be constructed on the output side 108B of the isolation barrier 104.

The differentiator 112 can be configured as a current mode differentiator.

A common mode suppression circuit 132 can be coupled between the isolation barrier 104 and the recovery circuit 126. The common mode suppression circuit 132 can be configured to maintain differentiation in a linear range.

Figure 1C:
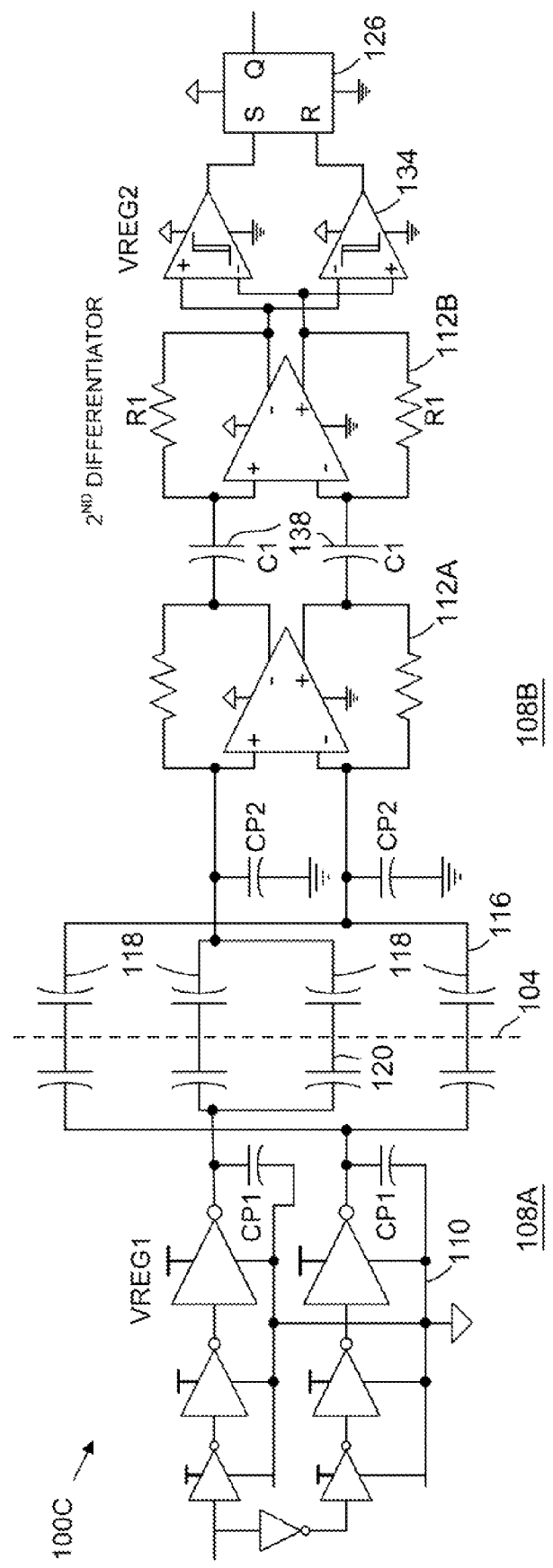
FIG. 1C is a schematic block diagram showing an embodiment of a signal isolator configured as a digital isolator with multiple differentiators.

Referring to FIG. 1C, a schematic block diagram illustrates an embodiment of a signal isolator 100C configured as a digital isolator with multiple differentiators. The signal isolator 100C comprises an isolation barrier 104, a transmitter 110, and a recovery circuit 126. The isolation barrier 104 forms a differential transmission pathway 116 comprising multiple differential lines 118, each comprising multiple parallel capacitive pathways 120 configured to create magnetic and electrical differentiality. A transmitter 110 coupled to a first side 108A of the isolation barrier 104 is configured to receive and convert an information signal to a differential signal that encodes information in the information signal in a single transition edge. The recovery circuit 126 is coupled to the differentiator 112 and configured to recover an output information signal based on the information in the single transition edge.

The signal isolator 100C can further comprise a differentiator 112 coupled to the second side 108B of the isolation barrier 104 which is isolated from the first side 108A of the isolation barrier 104. The differentiator 112 differentiates the differential signal. In the illustrative embodiment, multiple differentiators 112A, 112B can be coupled to the second side 108B of the isolation barrier 104 and configured to separate a common error signal from differential.

Double differentiation further separates the common mode error signal from the differential signal. The first differentiator 112A can be implemented to saturate gracefully during common-mode events, including for example some surge protection, preventing generation of a differential error. Accordingly, implementation of multiple differentiators enables omission of a common-mode suppression circuit.

The illustrative signal isolator 100C can include a parasitic capacitor 138 between the differentiators 112A and 112B. The parasitic capacitors 138 can be positioned to attain power estimation. Parasitic poles can limit performance in the first 112A and second 112B differentiators. For example, the second differentiator can have a parasitic pole at $\omega=1/RC$. To avoid the parasitic poles in the voltage domain, a possible solution can use implementation in current mode. Accordingly, in some embodiments the differentiator or differentiators 112 can be configured as current mode differentiators.

The recovery circuit 126 for the multiple differentiator implementation of the signal isolator 100C is generally more complex than that for a single differentiator implementation. A single edge from the transmitter 110 produces two pulses from the differentiator 112. A unique quality of the pulses is that spacing is a function of rise time of the transmitter 110. Common-mode interference resulting from mismatches that leak into the differential creates pulses that are not as closely spaced. A timer in the recovery circuit 126 only changes the output state when spacing between pulses are sufficiently close, leading to production of another level of immunity and enabling reduction of the power requirements for the receiver with the tradeoff that speed on the isolator is reduced.

The signal isolators 110A, 100B, and 100C are typically configured with fully differential paths to attain predetermined skew requirements, for example rise-to-fall edge delay mismatch of less than about 1 nsec although any suitable specification may be implemented.

Referring to FIGS. 2A and 2B, a schematic circuit diagram and associated system respectively illustrate an embodiment of a current-mode differentiator 200 that can be implemented in various implementations of a signal isolator. The illustrative structure is a single-ended input current-mode differentiator. The differentiator 200 can be implemented using current mode techniques. The illustrative differentiator 200 can be formed using a current-in, current-out design which has low input impedance. The illustrative common-mode techniques can have a hidden open-loop characteristic which is typically tolerable in the illustrative application. FIGS. 2A and 2B depict a differentiator with a single-ended input terminal and differential output terminals. A fully-differential configuration can be implemented wherein the common-mode feedback in the design provides the common-mode suppression that is used to maintain the design in the linear range during common-mode transients.

Figure 2C:
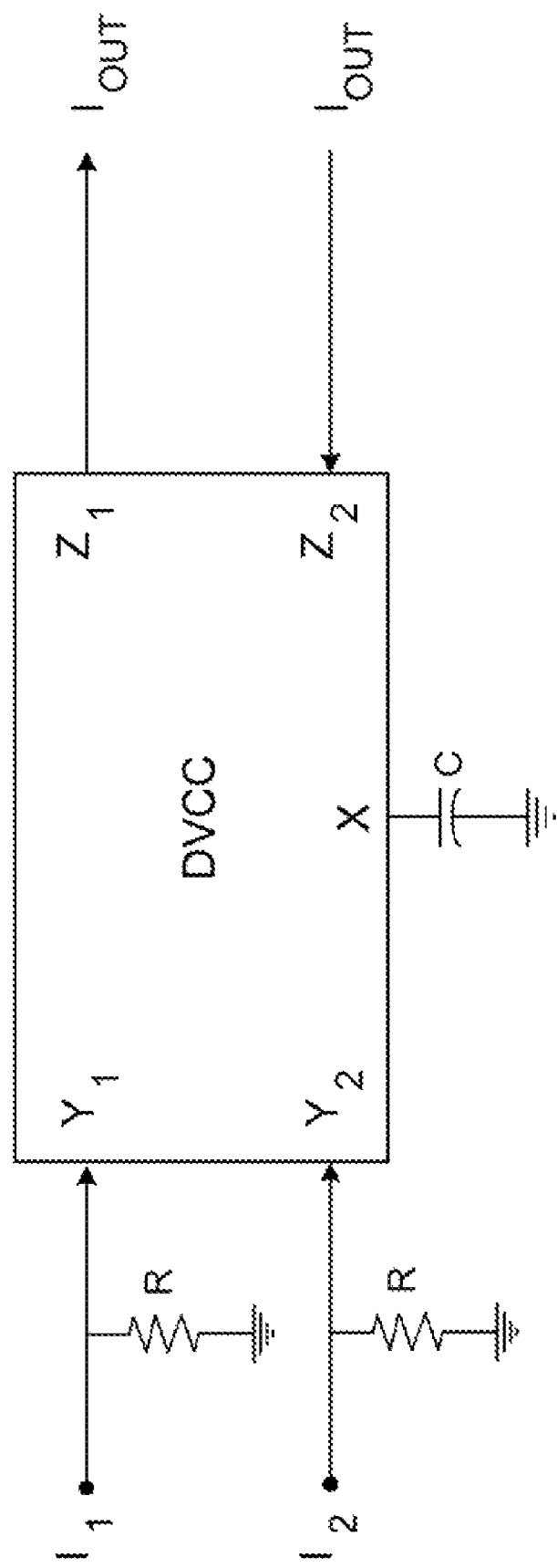
FIG. 2C is a block diagram illustrating another embodiment of a current-mode technique using a current conveyor that can be used in a differentiator.

Other embodiments may employ a differential current conveyor technique, as depicted in FIG. 2C which operates according to equation $Z(I)=V(Y_1-Y_2)Z(X_1-X_2)$.

A suitable voltage mode differentiator can be difficult to implement in the digital isolator due to the presence of parasitic poles. Accordingly, current mode techniques can be used to avoid parasitic poles. FIGS. 2A and 2B illustrate a current mode differentiator 200 that passes a current with low impedance that is useful for pulling current from capacitors on the isolation boundary. Accordingly, the common mode differentiator 200 can be used so that the transmission signal is passed through the isolation barrier to a low impedance node. In contrast, other isolation barrier embodiments, such as a transformer barrier that produces a voltage, passes the signal to a high impedance node, for example a latch.

The differentiator, particular the current mode differentiator, enables faster response to a differential signal, better bandwidth, and also forms an inherently low impedance input that facilitates common mode rejection and handling of high common mode transients. A differentiator formed according to a current mode approach has low impedance that is inherently better to handle the high common mode transients affecting the isolator.

In general, an isolation barrier implemented with capacitors is better for passing signals to low impedance node than a barrier formed from inductors.

Figure 3:
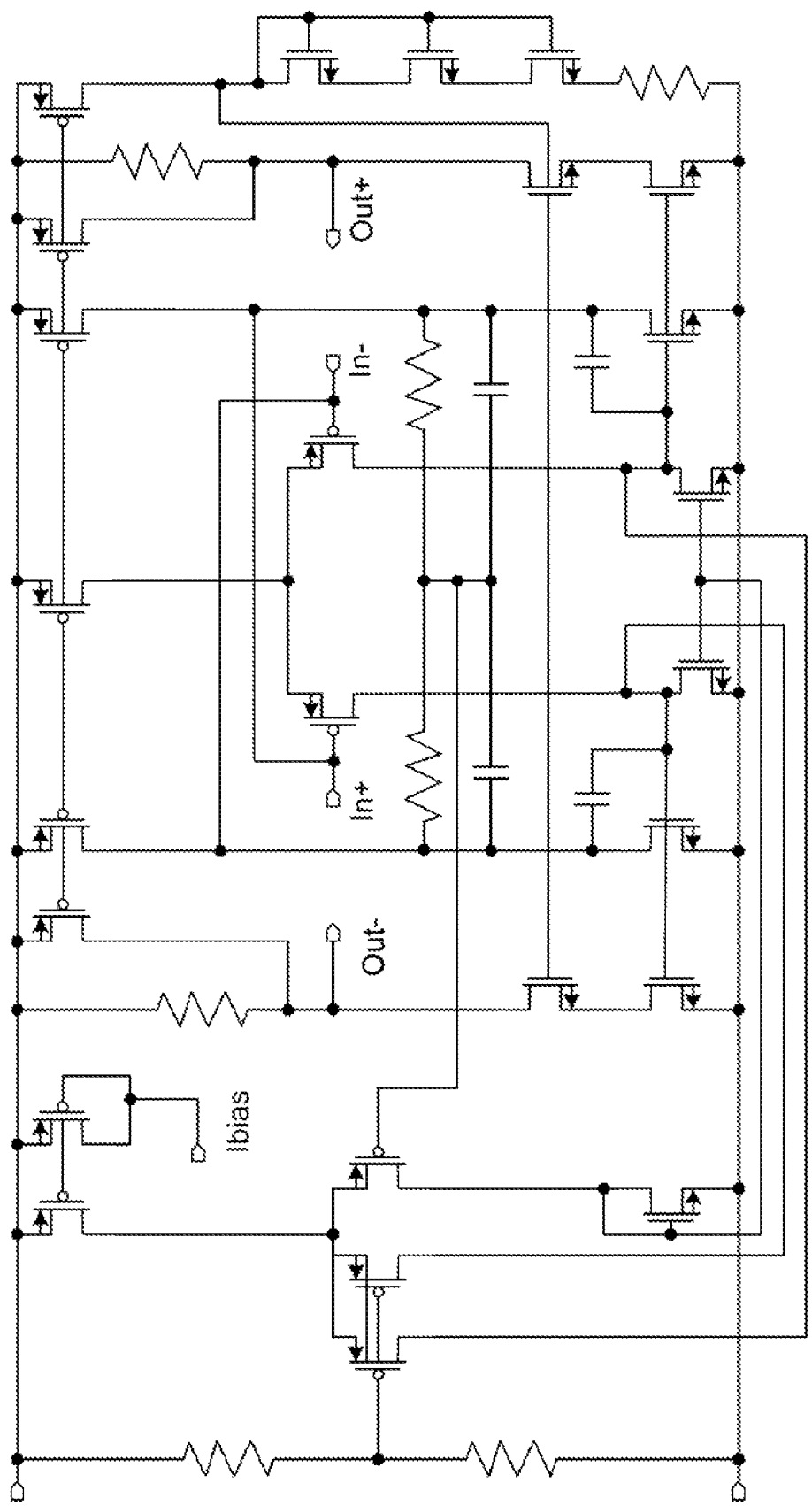
FIG. 3 is a schematic circuit diagram depicting an embodiment of a current-mode differentiator that can be implemented in a digital signal isolator.

Referring to FIG. 3, a schematic circuit diagram illustrates an embodiment of a differentiator 300 that can be implemented in a digital signal isolator.

Figure 4:
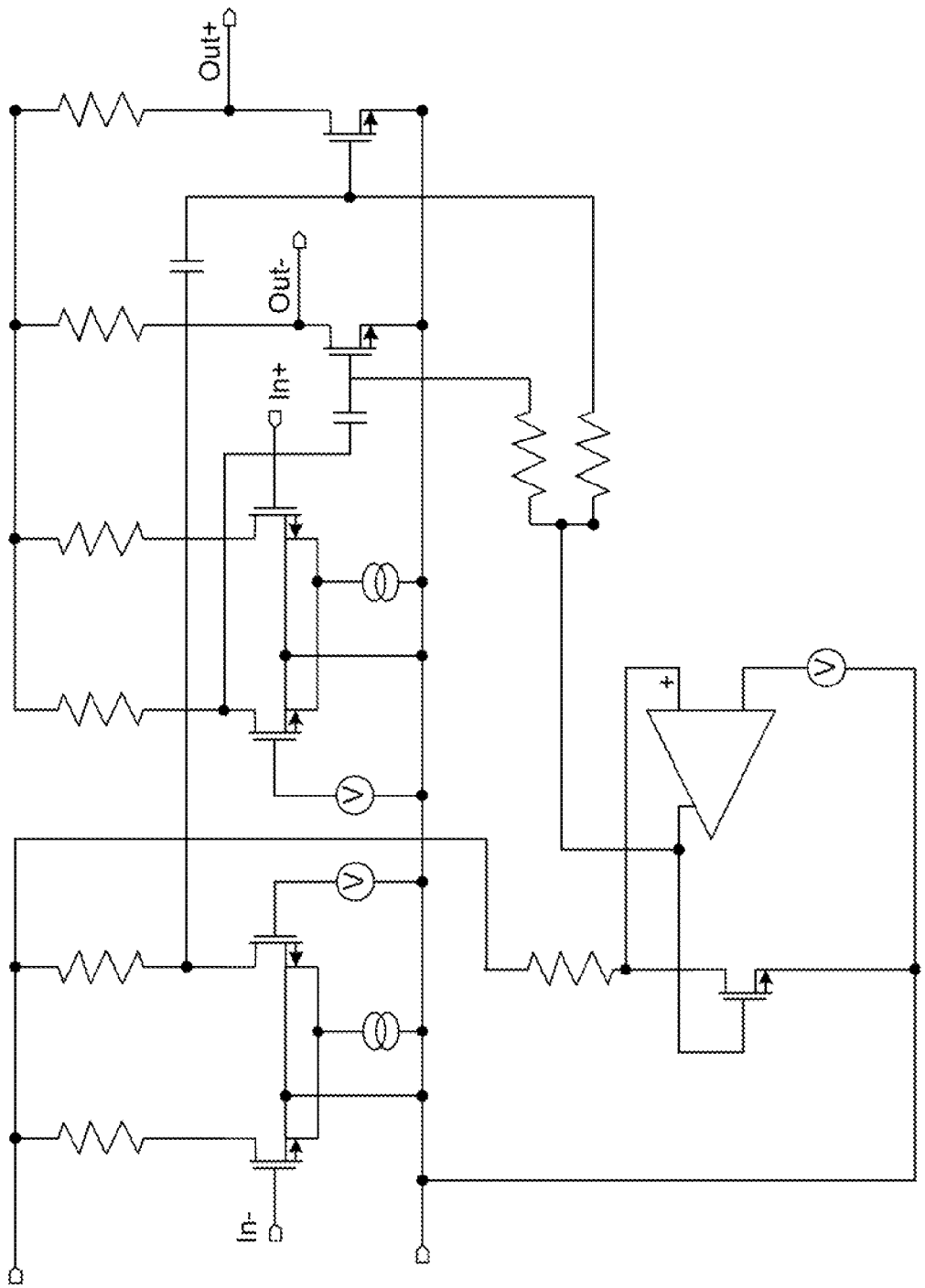
FIG. 4 is a schematic circuit diagram showing an embodiment of a comparator that can be implemented in a digital signal isolator.

Referring to FIG. 4, a schematic circuit diagram shows an embodiment of a comparator 400 that can be implemented in a digital signal isolator.

Referring to FIGS. 5A, 5B, and 5C, a set of time waveforms illustrate aspects of operation of a first differentiator output signal. FIG. 5A shows an example of a data output signal and the portion of the signal that results from common-mode noise. The data output signal shows output voltage of the first differentiator output terminal, illustratively showing a 50 kV/μsec test at true ground. A single pulse is generated for the normal differential which is overlaid by the response to a normal fast transmission edge out of the first differentiator, which is a pulse. The common-mode noise signal results from capacitive mismatch, for example of about the order of one percent, and leads to some differential signal but is rejected by the differentiator and does not produce a large output pulse so the differentiator.

FIG. 5B shows results of a 50 kV/μsec slew test and indicates how two grounds can move apart. FIG. 5C illustrates differential input drive as the normal differential edge that does the transmission. The differential pulse produces a large output signal whereas the common-mode implementation leads to differential pulse due to capacitor mismatch, but with a much slower edge leading to a smaller pulse amplitude.

Figure 6A:
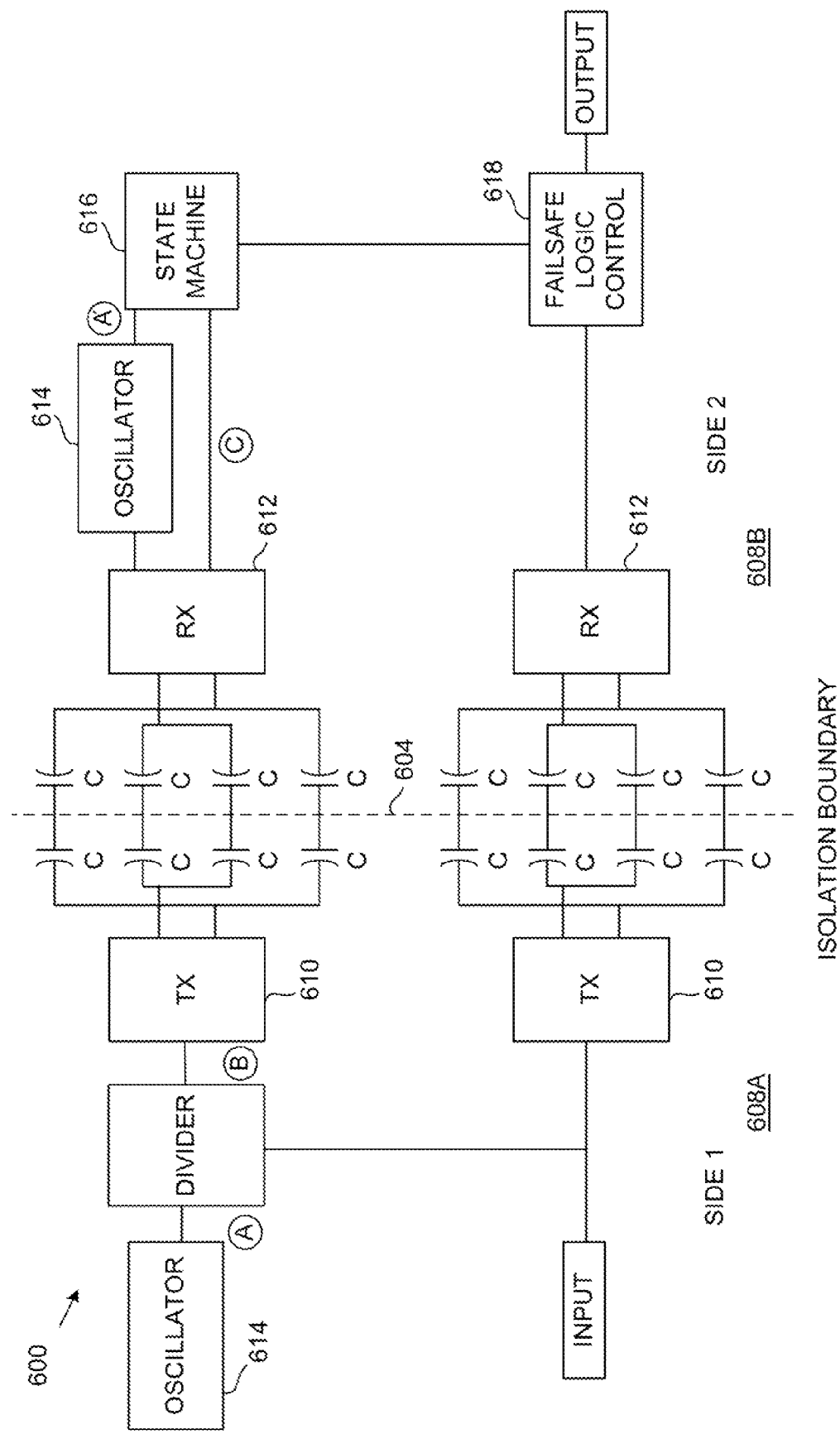
FIGS. 6A and 6B are schematic block diagrams showing an embodiment of a signal isolator that implements channel management.

Referring to FIG. 6A, a schematic block diagram illustrates an embodiment of a signal isolator 600 that implements channel management. The signal isolator 600 comprises an isolation barrier 604 that isolates first 608A and second 608B domains and one or more fully differential transmitters 610 in the first domain 608A which are configured to transmit a digital signal containing all information in an information signal in an edge of a single transition across the isolation barrier 604 to the second domain 608B. The signal isolator

600 further comprises one or more fully differential receiver 612 in the second domain 608B which are configured to receive and differentiate the transmitted digital signal.

In a particular embodiment, the signal isolator 600 can comprise an isolation barrier 604, and first 608A and second 608B separate dies from a common wafer. The signal isolator 600 can comprise a transmitter 610 on the first die 608A and a receiver 612 on the second die 608B in a configuration that communicates an information signal across the isolation barrier 604 as a digital signal that contains all information in a single transition edge. The signal isolator 600 can further comprise oscillators 614 on the first 608A and second 608B dies that are to be matched to a reasonable tolerance due to close location of the dies on the integrated circuit wafer.

The illustrative signal isolator 600 implements a management channel concept and includes a structure with two or more channels, each of which has a transmitter 610 and receiver 612 positioned across the isolation boundary 604 with the multiple channels positioned side-by-side to enable comparison of timing or frequency signals.

The two or more channels are positioned side-by-side to maintain state if the state is corrupted for some reason or condition. The multiple channels enable state to be maintained when clock signals are corrupted. Maintenance of the channels is useful in the illustrative edge-based system because corruption that results in termination of edge transitions could possibly enter state that cannot be restored.

Corruption can occur during operation of the system or during power-up. The illustrative signal isolator 600 can include a power-on reset (POR) element 620 that functions in combination with the state machine 616 and fail-safe control logic 618. For example, initially upon system power-up no edge transitions may be generated. Control logic in the signal isolator 600, including the POR function element 620 and failsafe logic control 618, ensures that the correct system state can be determined.

Figure 6B:
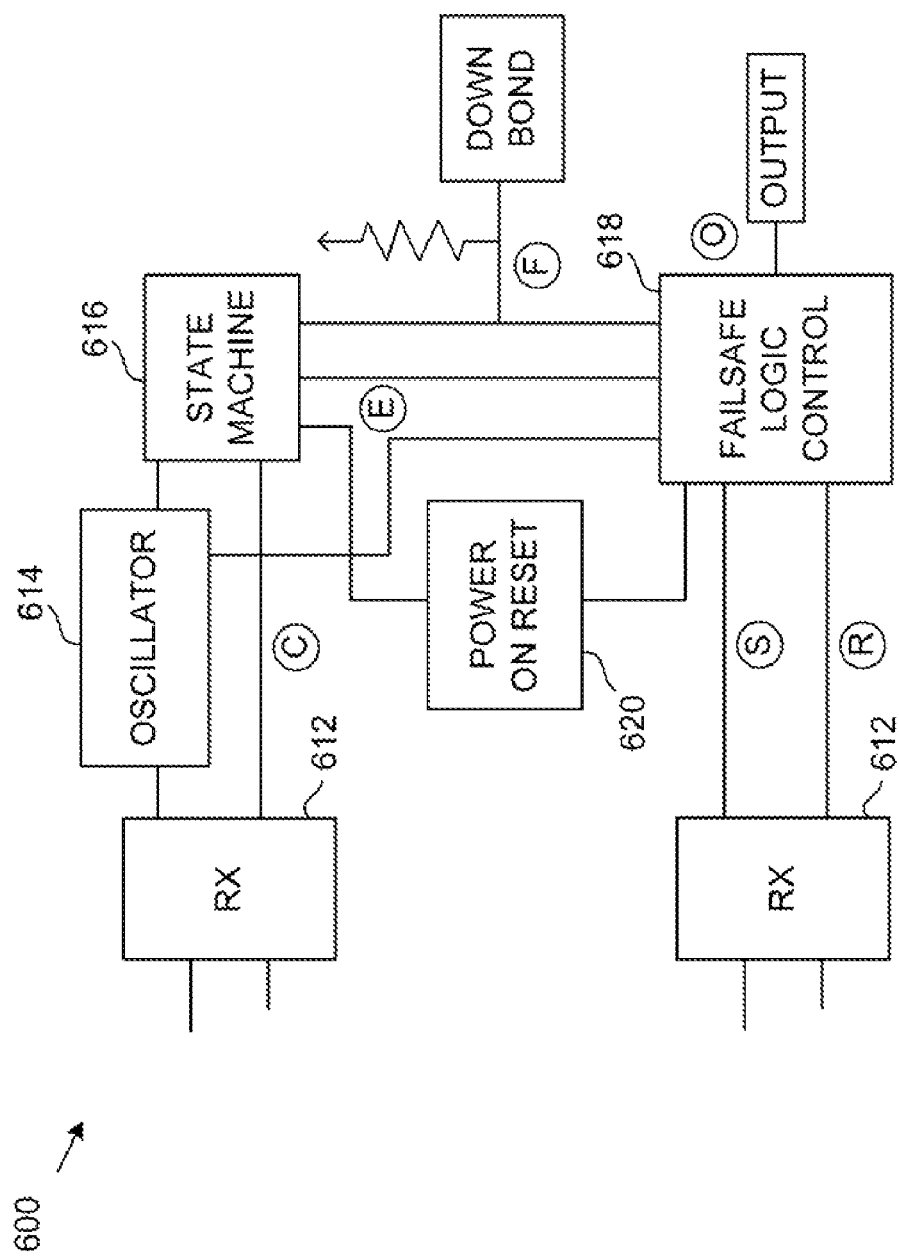

Referring to FIG. 6B, a schematic block diagram illustrates an example embodiment or implementation of management control structures on the second die 608B. The signal isolator 600 can further comprise a state machine 616 coupled to the receiver 612 on the second die 608B and a failsafe logic 618 coupled to the state machine 616 on the second die. The state machine 616 and the failsafe logic 618 can be configured to determine frequency of a signal transmitted across the isolation barrier 604, compare frequency of a local oscillator signal to the frequency of the transmitted signal, and correct transmitted state based on the comparison.

Figure 7:
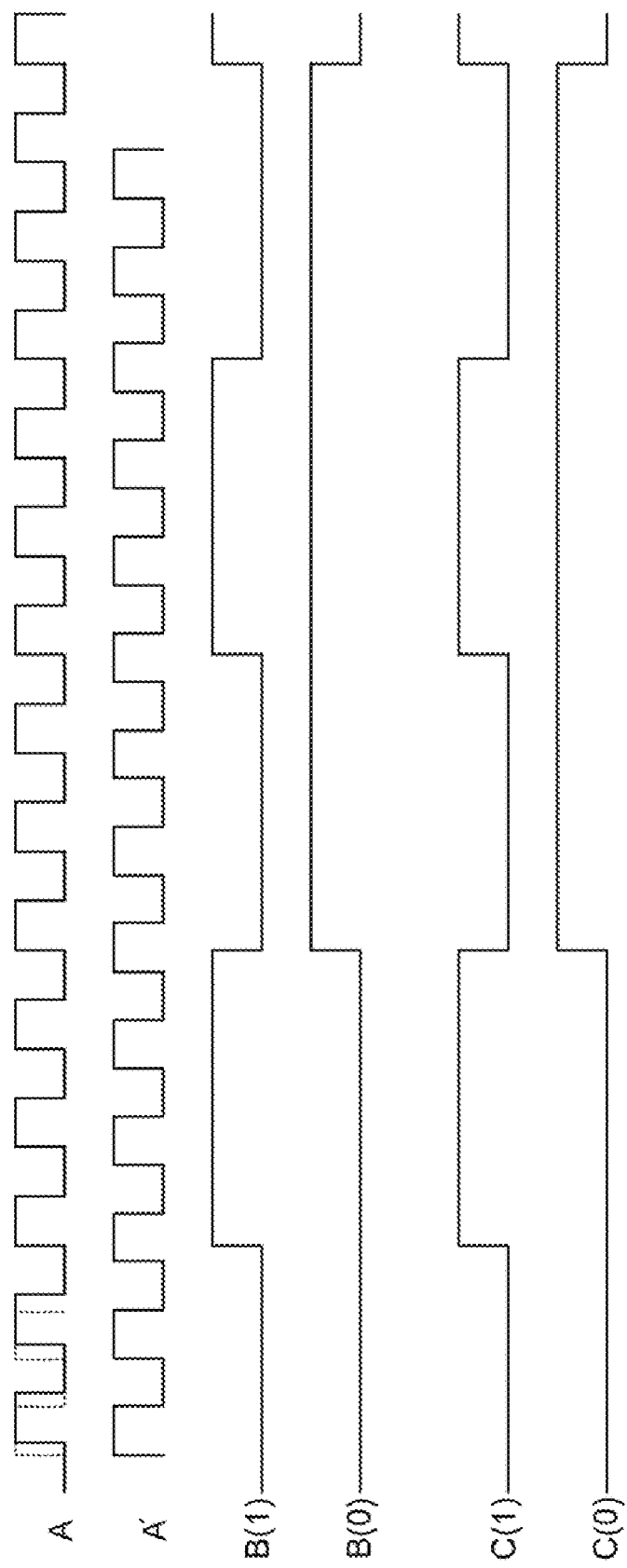
FIG. 7 is a set of time waveforms depicting digital signals at several locations in the digital isolator and illustrating usage of a second isolator channel to ensure failsafe operation.

Referring to FIG. 7 in combination with FIG. 6A, a set of time waveforms depicts digital signals at several locations in the digital isolator 600 including a signal A generated by the oscillator 614 on the first die 608A, a signal B that results from passage of the signal from the oscillator through a divider, and a signal C passed by the receiver 612 on the second die 608B that receives a signal transmitted across the isolation barrier 604. Signal A' is generated by the oscillator 614 on the second die 608B. The time waveforms and illustrate usage of a second isolator channel to ensure failsafe operation.

Dotted lines for signal A depict clock frequency variation, for example ±44%, due to process variability. In an example implementation, the variation in clock frequency from die-to-die can be limited to a suitable amount, for example ±5% by using two dies from the same wafer with additional improvement attained by using dies that are adjacent from the same wafer.

The separate dies can be constructed from the same wafer, or from adjacent locations on the same wafer, so that the constructed package has circuit dies that are mirror images of one another with one die implementing a transmitter and the other die implementing a receiver, and each die implementing an oscillator. The mirror images ensure relative matching of clock signals.

Signals B(1) and B(0), and signals C(1) and C(0) depict signals at common positions in different channels.

Signals B(1) and B(0) are transmitted from the output terminal of the divider on first die 608A based on whether the transmitted data bit is either a one or a zero. Signals C(1) and C(0) depict signals recovered on second die 608B that can then be compared in the state-machine which use the oscillator 614 on die 608B to measure the frequency of the transmitted data. Transmission is much slower than the normal path but can be used to ensure that the receive data is correct should the date be incorrect and enable failsafe startup operation by ensuring that output data remains fixed until both dies 608A and 608B are powered and operational.

Figure 8A:
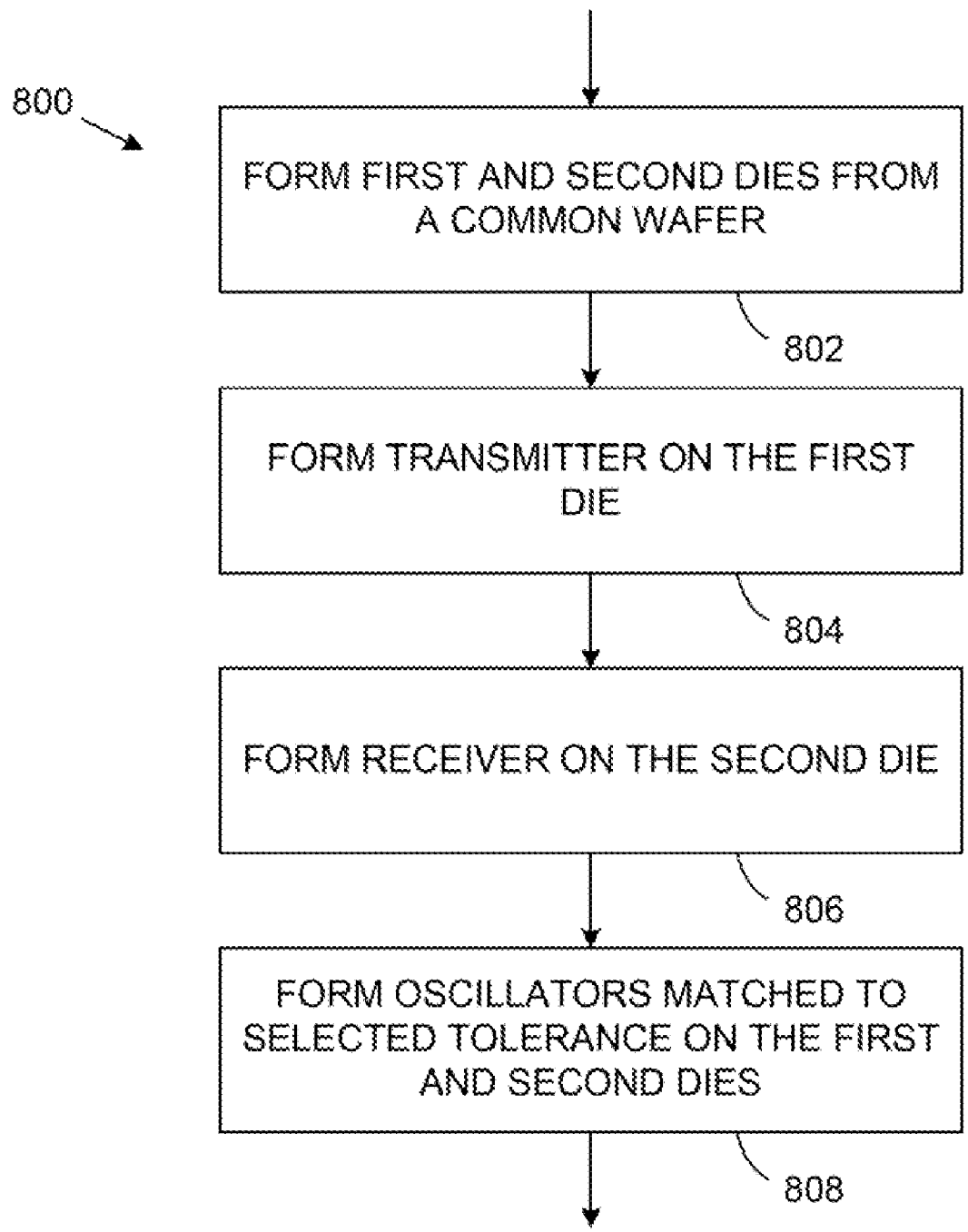
FIGS. 8A and 8B are flow charts illustrating embodiments of a method for constructing a signal isolator.

Referring to FIG. 8A with regard to the structures shown in FIGS. 6A and 6B, a flow chart illustrates an embodiment of a method 800 for constructing a signal isolator. The method 800 comprises forming 802 first and second separate dies from a common wafer. A transmitter is formed 804 on the first die and a receiver formed 806 on the second die in a configuration that communicates an information signal across an isolation barrier as a digital signal that contains all information in a single transition edge. Oscillators are formed 808 that are matched to a selected tolerance on the first and second dies.

In some embodiments, the first and second separate dies can be formed 802 from adjacent positions on the common wafer, enabling a reduction in clock frequency variation between the two dies.

The transmitter and the receiver can be formed with matching on the first and second dies whereby communication correctness is ensured.

The oscillators can be configured to communicate information across the isolation barrier by frequency modulation.

Figure 8B:
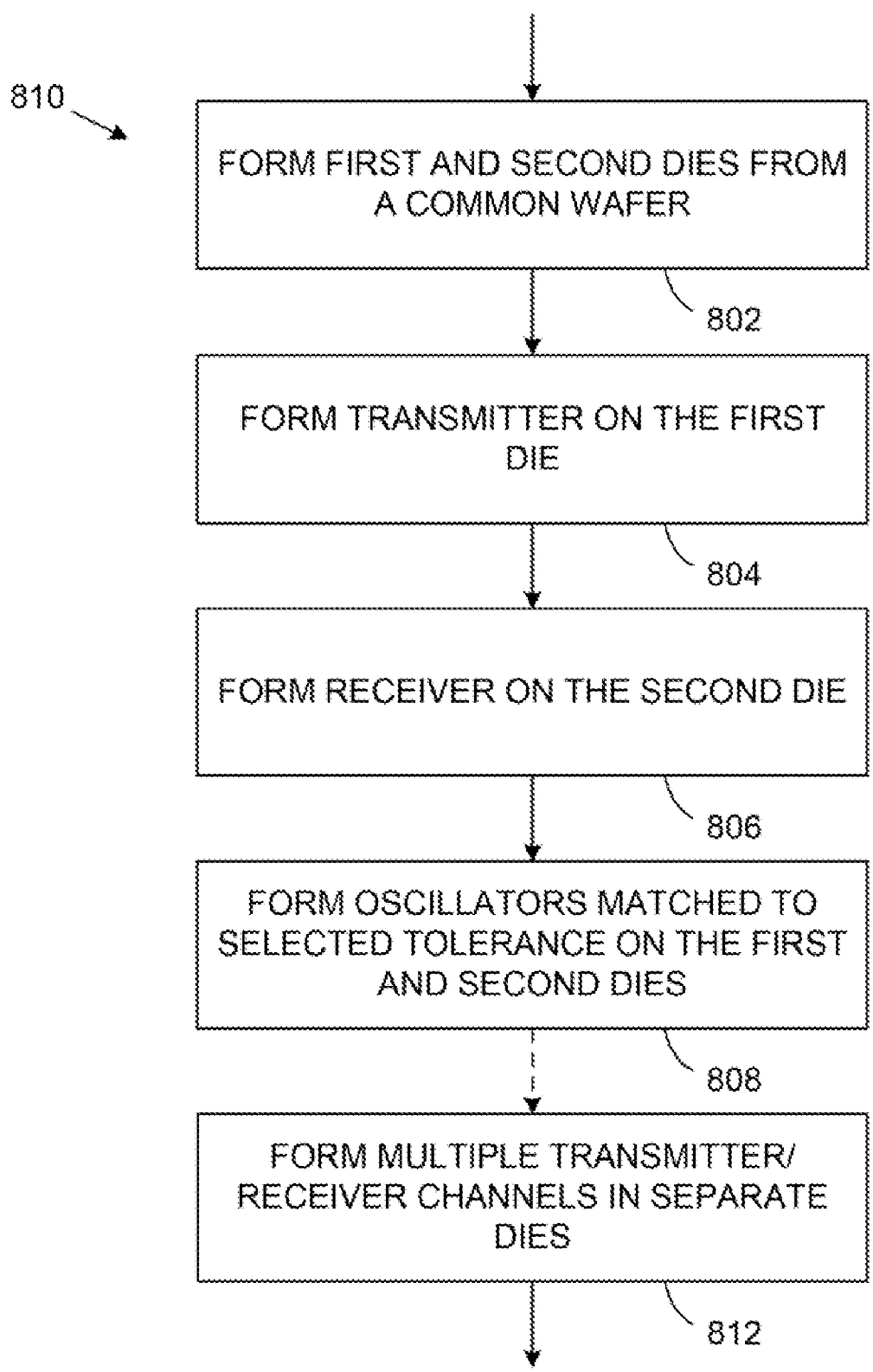

Referring to FIG. 8B, a flow chart illustrates an embodiment of a method 810 for constructing a signal isolator that further comprises forming 812 two or more transmitter-receiver channels in the first and second separate dies enabling comparison of communication signals between channels and correction of corrupted edge transmission.

Figure 9:
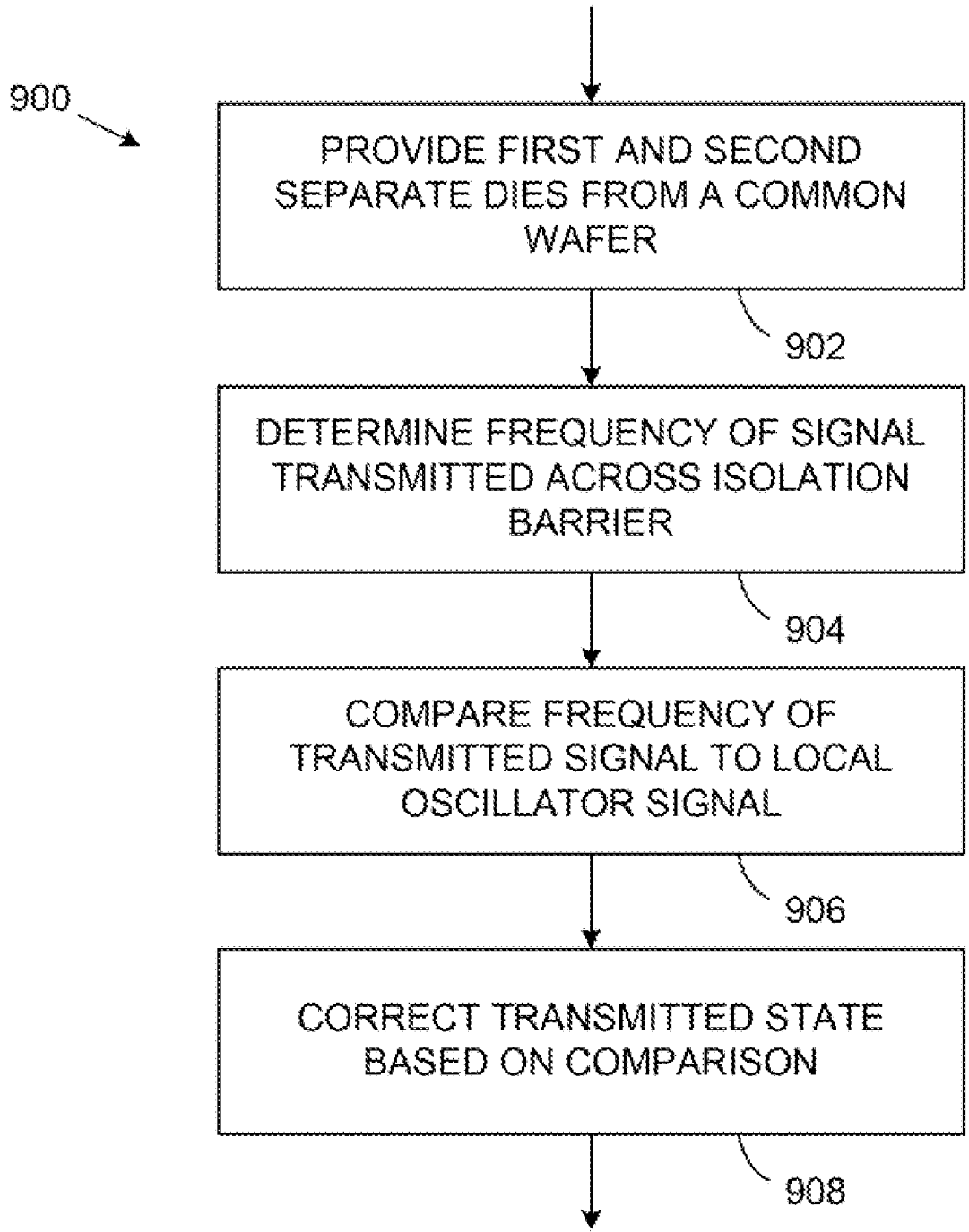
FIG. 9 is a flow chart showing an embodiment of a method for operating a signal isolator.

Referring to FIG. 9 with regard to the structures shown in FIGS. 6A and 6B, a flow chart illustrates an embodiment of a method 900 for operating a signal isolator. First and second separate dies are provided 902 from a common wafer comprising a transmitter on the first die and a receiver on the second die in a configuration that communicates an information signal across an isolation barrier as a digital signal that contains all information in a single transition edge, and oscillators that are matched to a selected tolerance on the first, and second dies. The method 900 further comprises determining 904 frequency of a signal transmitted across the isolation barrier and comparing 906 frequency of a local oscillator signal to the frequency of the transmitted signal. Transmitted state is corrected 908 based on the comparison.

Figure 10A:
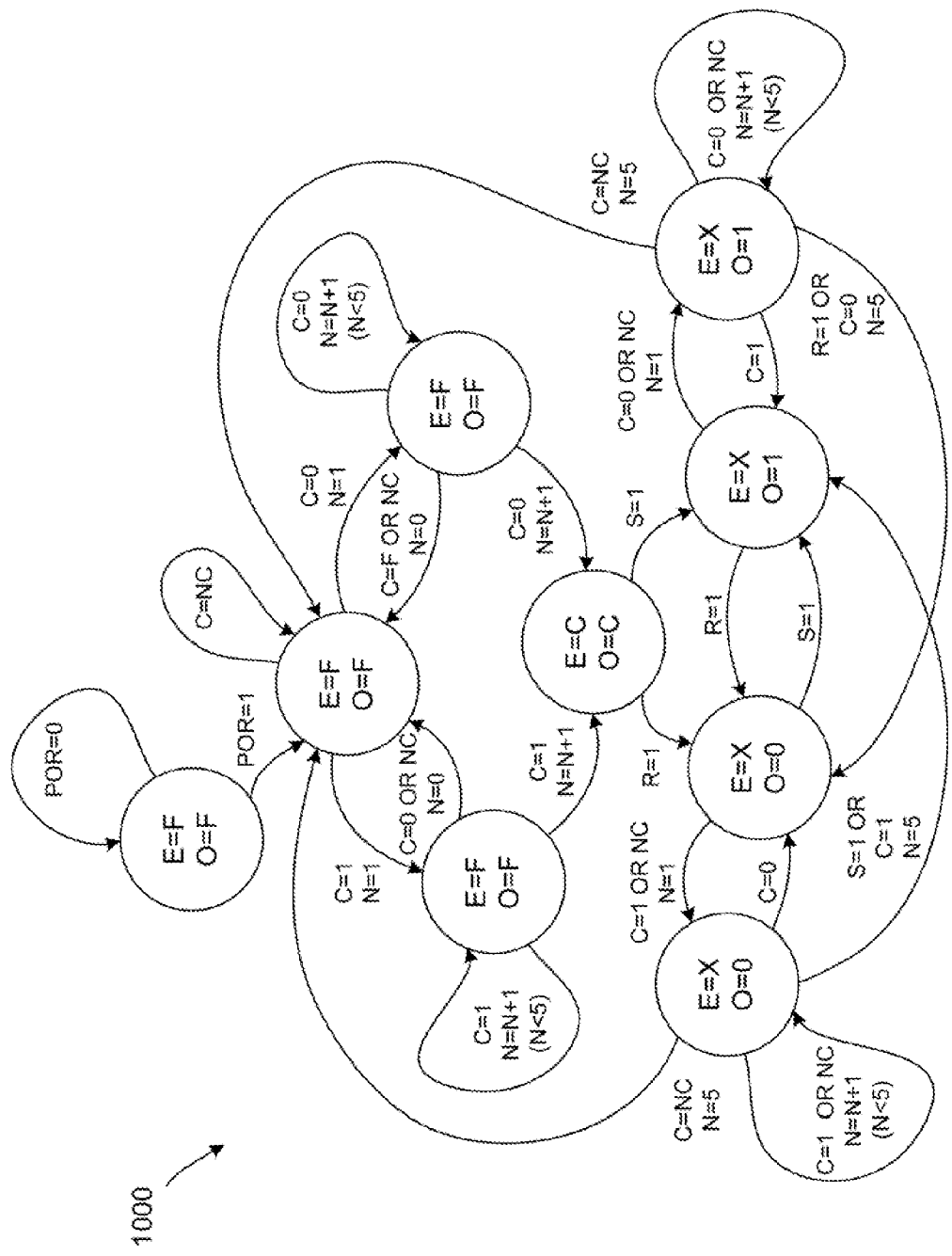

Referring to FIG. 10A in combination with the structures shown in FIGS. 6A and 6B, a state diagram 1000 illustrates an embodiment of operation of the state machine 616 and failsafe logic 618 for managing channels in the signal isolator 600. Also referring to FIG. 10B in combination with FIGS. 6A and 6B, a set of time waveforms depicts digital signals at several locations in the digital isolator 600 including a power-on-reset (POR) signal, the signal C which is passed by the receiver 612 on the second die 608B that receives a signal transmitted across the isolation barrier 604, and signals S and R that are passed from the receiver 612 to the failsafe logic 618. Waveforms further include a signal E that passes as control from the state machine 616 to the failsafe logic 618, and an output signal O.

A first data bit is delayed until power-up of side 1 is verified. The control logic ensures that the digital isolator 600 changes state due to power-up transients. Delay time is variable for a particular implementation although a common range can be 0.32-1.44 μsec.

The illustrative channel management technique has two aspects including usage of two separate dies for the respective transmitter and receiver channels with oscillators on each die, and a control logic to ensure the correct state on power-up.

The two side-by-side channels include one channel enabling high-speed operation to the main channel so that no modulation technique is implemented except for the edge transition. The second channel is a maintenance or management channel to ensure that a state that becomes corrupted for any reason which results in no edge transmission will be corrected.

The state diagram 1000 can be configured to initially avoid transition based on any type of noise, for example by controlling a secondary channel, which can be a management channel, to initially ignore changes on the primary channel but only respond to changes in the secondary channel In operation subsequent to initialization, the secondary channel can respond to changes in the primary channel.

The oscillators are located on both sides of the package, in each of the separate dies, and are presumed to be well-matched to a selected tolerance such as ±5%. Digital frequency measuring can be used to measure the frequency transmit state, as shown in waveform C in FIG. 10B, so that when a logical 1 is transmitted the waveform frequency is higher, and when transmitting a logic 0 the frequency is lower. for example by approximately half. Accordingly, the logic signal is communicated as a shift in frequency.

On the second die, the receiver 612 receives transmitted information and passes the information to the state machine 616 that uses the local oscillator 614 to detect frequency local to the second die. Because the timing components on the two dies are taken from the same wafer and have suitable relative matching, the transmitted timing signals and timing signals generated locally to the second die can be compared, enabling detection of the transmission state for parallel channel management.

The state diagram 1000 shows operation wherein a departure from normal operation detectable as a state on the second die that does not match the transmitted state through the management channel that endures for a selected time, for example a microsecond or several microseconds, activates correction of the state. The corrupted state from any cause, for example an alpha particle or other noise, can be detected and corrected on the second side. The management channel ensures that the state is corrected.

In the illustrative embodiment, the power-on-reset (POR) element 620, the failsafe logic 618 and the state machine 616 operate in combination to control the management channel interaction in normal operation without impacting highspeed operation. If an error condition causes a mismatch in the transmitted and local timing signals on the second side that is maintained for a particular number of time periods, for example five time periods as shown, the control logic will correct the state. The frequency handling in shown in FIG. 10B at line C with the frequency changing from a higher frequency to a lower frequency.

Figure 11A:
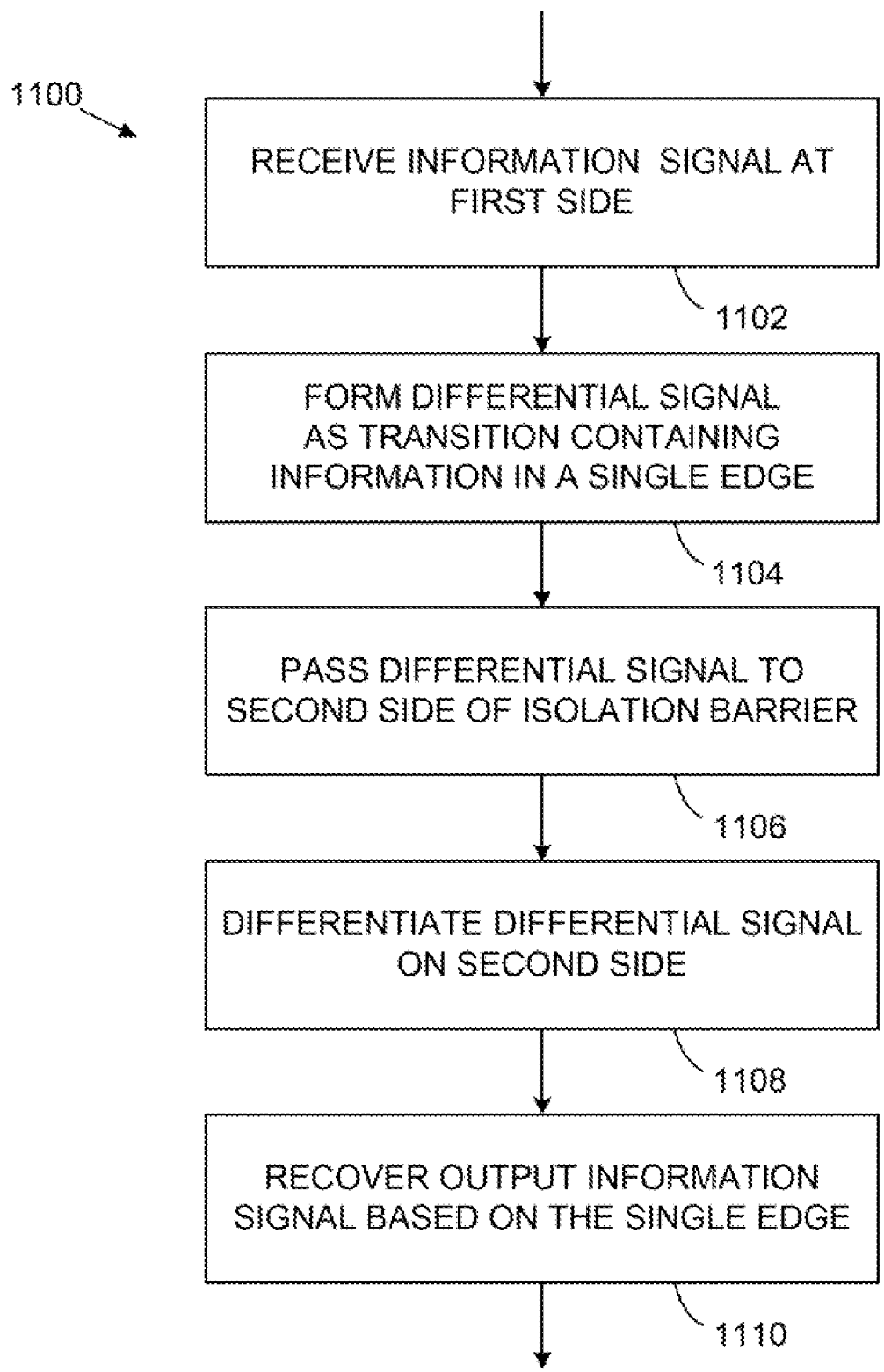
FIGS. 11A through 11C are a set of flow charts showing embodiments and aspects of various embodiments of a method for communicating an information signal across an isolation barrier.
Figure 11B:
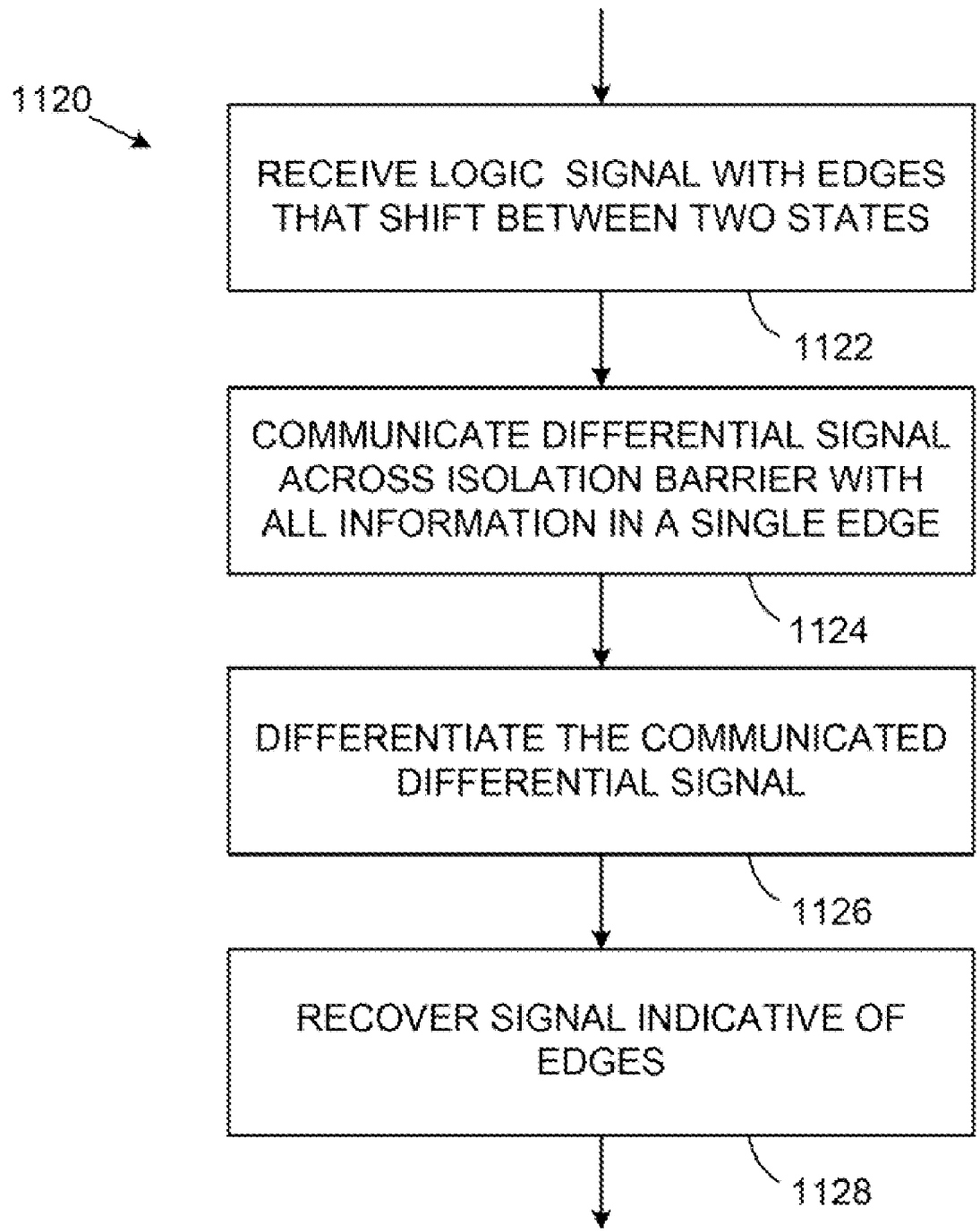
Figure 11C:
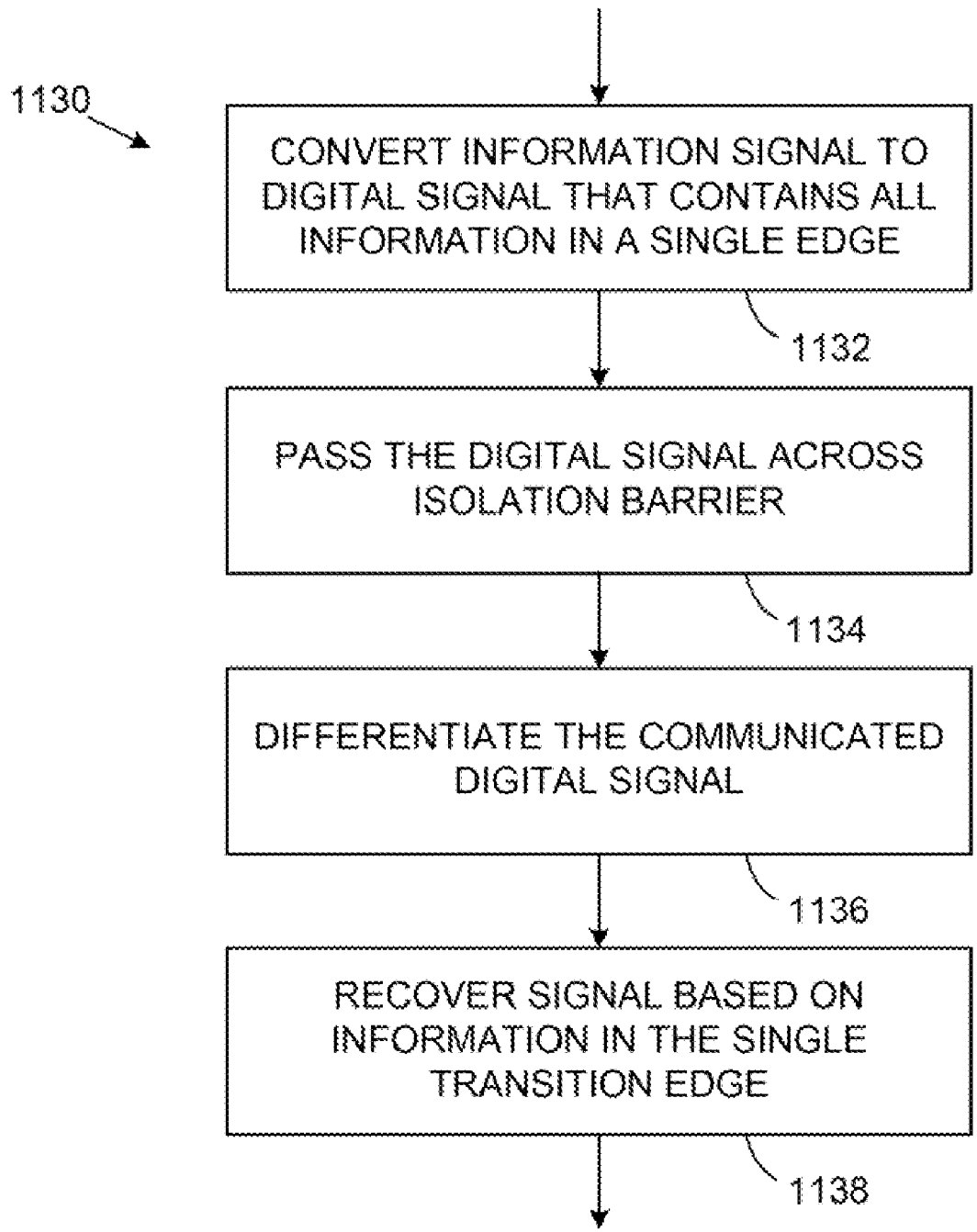

Referring to FIGS. 11A through 11C, a set of flow charts illustrates embodiments and aspects of various embodiments of a method for communicating an information signal across an isolation barrier. FIG. 11A shows an embodiment of a method 1100 for transmitting art information signal from a first side to a second side of an isolation barrier comprising receiving 1102 the information signal at the first side and forming 1104 a differential signal from the information signal as a transition that contains all information in a single transition edge. The differential signal is passes 1106 to the second side of the isolation barrier and differentiated 1108. An output information signal is recovered 1110 on the second side of the isolation barrier based on the information in the single transition edge.

In some embodiments, the output information signal can be recovered 1110 on the second side of the isolation barrier using positive feedback.

In various embodiments, the differential signal can be passed through any suitable isolation barrier, for example the differential signal can be passes across a capacitive isolation barrier, an inductive isolation barrier, or other barrier.

In some embodiments, the passed signal can be differentiated 1108 so that a common-mode-to-differential component is separated from true differential components.

In one implementation, the passed signal can be differentiated 1108 in a single stage with differentiation maintained in a linear range by common mode suppression. In another implementation, the passed signal can be differentiated in multiple stages so that linear differentiation is maintained without common mode suppression.

FIG. 11B shows an embodiment of a method 1120 for transmitting an information signal from a first side to a second side of an isolation barrier that comprises receiving 1122 a logic signal with first and second transition edges that shift the logic signal between two states and communicating 1124 a differential signal across an isolation barrier that contains all information in the logic signals in a single transition edge. The communicated differential signal is differentiated 1126 and a signal indicative of the first and second transition edges from the differentiated signal is recovered 1128.

The differential signal can be communicated 1124 across the isolation barrier on a fully differential pathway, FIG. 11C illustrates another embodiment of a method 1130 for transmitting a signal from a transmitting circuit across an isolation barrier to a receiving circuit comprising converting 1132 an information signal to a digital signal that contains all information in the information signal in a single transition edge and passing 1134 the digital signal across the isolation barrier. The passed digital signal is differentiated 1136 and an output information signal is recovered 1138 from the differentiated digital signal based on the information in the single transition edge, for example using positive feedback.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element, by inference, includes direct and indirect, coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various aspects or portions of a communication or isolation system are described including several optional implementations for particular portions. Any suitable combination or permutation of the disclosed designs may be implemented.

What is claimed is:

1. A method for transmitting an information signal from a first side to a second side of an isolation barrier comprising:
    receiving the information signal at the first side;
    encoding a differential signal from the information signal as a transition that contains all information in a single transition edge;
    passing the differential signal to the second side of the isolation barrier;
    differentiating the passed signal on the second side of the isolation barrier; and
    recovering an output information signal on the second side of the isolation barrier based on the information in the single transition edge.

2. The method according to claim 1 further comprising:
    recovering the output information signal on the second side of the isolation barrier using positive feedback.

3. The method according to claim 1 further comprising:
    passing the differential signal across a capacitive isolation barrier.

4. The method according to claim 1 further comprising:
    passing the differential signal across an inductive isolation barrier.

5. The method according to claim 1 further comprising:
    differentiating the passed signal whereby a common-mode-to-differential component is separated from true differential components.

6. The method according to claim 1 further comprising:
    differentiating the passed signal in a single stage; and
    maintaining differentiation in a linear range by common mode suppression.

7. The method according to claim 1 further comprising:
    differentiating the passed signal in multiple stages whereby linear differentiation is maintained without common mode suppression.

8. A method for transmitting an information signal from a first side to a second side of an isolation barrier comprising:
    receiving a logic signal with first and second transition edges that shift the logic signal between two states;
    communicating a differential signal across an isolation barrier that contains all information in the logic signals in a single transition edge;
    differentiating the communicated differential signal; and
    recovering a signal indicative of the first and second transition edges from the differentiated signal.

9. The method according to claim 8 further comprising:
    communicating the differential signal across the isolation barrier on a fully differential pathway.

10. A method for transmitting a signal from a transmitting circuit across an isolation barrier to a receiving circuit comprising:
    converting an information signal to a digital signal that contains all information in the information signal in a single transition edge;
    passing the digital signal across the isolation barrier;
    differentiating the passed digital signal; and
    recovering an output information signal from the differentiated digital signal based on the information in the single transition edge.

11. The method according to claim 10 further comprising:
    recovering the output information signal using positive feedback.

12. A method for constructing a signal isolator comprising:
    forming first and second separate dies from a common wafer; and
    forming a transmitter on the first die and a receiver on the second die in a configuration that communicates an information signal across an isolation barrier as a digital signal that contains all information in a single transition edge.

13. The method according to claim 12 further comprising:
    forming the transmitter and the receiver wherein the first and second dies are matched and communication correctness is ensured.

14. The method according to claim 12 further comprising:
    forming oscillators that are matched to a selected tolerance on the first and second dies.

15. The method according to claim 14 further comprising:
    configuring the oscillators to communicate information across the isolation barrier by frequency modulation.

16. The method according to claim 12 further comprising:
    forming the first and second separate dies from adjacent positions on the common wafer.

17. The method according to claim 12 further comprising:
    forming at least two transmitter-receiver channels in the first and second separate dies in a configuration that enables comparison of communication signals between channels and correction of corrupted edge transmission.

18. A method for operating a signal isolator comprising:
    providing first and second separate dies from a common wafer comprising a transmitter on the first die and a receiver on the second die in a configuration that communicates an information signal across an isolation barrier as a digital signal that contains all information in a single transition edge, and oscillators that are matched to a selected tolerance on the first and second dies;
    determining frequency of a signal transmitted across the isolation barrier;
    comparing frequency of a local oscillator signal to the frequency of the transmitted signal; and
    correcting transmitted state based on the comparison.

19. A signal isolator comprising:
    an isolation barrier;
    a transmitter coupled to a first side of the isolation barrier and configured to receive and convert an information signal to a differential signal that encodes information in the information signal in a single transition edge;
    a differentiator coupled to a second side isolated from the first side of the isolation barrier that differentiates the differential signal; and
    a recovery circuit coupled to the differentiator and configured to recover an output information signal based on the information in the single transition edge.

20. The signal isolator according to claim 19 further comprising:
the recovery circuit configured to recover the output information signal using positive feedback.

21. The signal isolator according to claim 19 further comprising:
the differentiator configured to separate a common-mode-to-differential signal component from true differential signal components.

22. The signal isolator according to claim 19 further comprising:
the differentiator configured as a current mode differentiator.

23. The signal isolator according to claim 19 further comprising:
a common mode suppression control circuit coupled to the differentiator and configured to maintain the differentiator in a linear range.

24. The signal isolator according to claim 19 further comprising:
a plurality of differentiators coupled to the second side of the isolation barrier and configured to separate a common mode error signal from differential.

25. The signal isolator according to claim 19 further comprising:
the recovery circuit comprising a comparator coupled to the differentiator and a feedback device coupled to the comparator.

26. The signal isolator according to claim 19 further comprising:
the recovery circuit comprising a peak detector coupled to the differentiator and a feedback device coupled to the peak detector.

27. A signal isolator comprising:
an integrated circuit substrate;
an isolation barrier formed by at least two interlayer metal dielectric capacitors that isolates a first domain from a second domain in the substrate;
a transmitter in the first domain coupled to the isolation barrier and configured to transmit an information signal through the isolation barrier;
a differentiator in the second domain coupled to the isolation barrier and configured to differentiate the transmitted information signal; and
a recovery circuit in the second domain coupled to the differentiator and configured to recover an output information signal based on the differentiated information signal.

28. The signal isolator according to claim 27 further comprising:
the recovery circuit configured to recover the output information signal using positive feedback.

29. The signal isolator according to claim 27 further comprising:
the isolation barrier forming a differential transmission pathway comprising a plurality of differential lines each comprising a plurality of parallel capacitive pathways configured to create magnetic and electrical differentiality.

30. The signal isolator according to claim 27 further comprising:
the differential transmission pathway comprising first and second differential lines, each differential line comprising two parallel pathways, each pathway comprising first and second capacitors coupled at a bond pad.

31. The signal isolator according to claim 30 further comprising:
the bond pads arranged in positions attaining first-order common-centroiding of the capacitors.

32. The signal isolator according to claim 27 further comprising:
the isolation barrier configured in an arrangement selected from arrangements comprising the at least two interlayer metal dielectric capacitors formed in the first domain, the at least two interlayer metal dielectric capacitors formed in the second domain, the at least two interlayer metal dielectric capacitors formed partly in the first domain and partly in the second domain, the at least two interlayer metal dielectric capacitors formed between the first and second domains, and the at least two interlayer metal dielectric capacitors formed partly in the first domain, partly in the second domain, and partly between the first and second domain.

33. The signal isolator according to claim 27 further comprising:
the differentiator configured as a current mode differentiator.

34. A signal isolator comprising:
an isolation barrier forming a differential transmission pathway comprising a plurality of differential lines each comprising a plurality of parallel capacitive pathways configured to create magnetic and electrical differentiality;
a transmitter coupled to a first side of the isolation barrier and configured to receive and convert an information signal to a differential signal that encodes information in the information signal in a single transition edge; and
a recovery circuit coupled to the differentiator and configured to recover an output information signal based on the information in the single transition edge.

35. The signal isolator according to claim 34 further comprising:
a differentiator coupled to a second side isolated from the first side of the isolation barrier that differentiates the differential signal.

36. The signal isolator according to claim 34 further comprising:
the differential transmission pathway comprising first and second differential lines, each differential line comprising two parallel pathways, each pathway comprising first and second capacitors coupled at a bond pad.

37. The signal isolator according to claim 34 further comprising:
a common mode suppression circuit coupled between the isolation barrier and the recovery circuit, the common mode suppression circuit configured to maintain differentiation in a linear range.

38. The signal isolator according to claim 34 further comprising:
the differentiator configured as a current mode differentiator.

39. A signal isolator comprising:
an isolation barrier;
a modulator coupled to an input side of the isolation barrier configured to receive a logic signal with first and second transition edges that shift the logic signal between two states, convert the logic signal to a differential signal, and pass the differential signal across the isolation barrier;
a differentiator coupled to an output side of the isolation barrier that differentiates the communicated differential signal; and a recovery circuit coupled to the differentiator that recovers a signal indicative of the first and second transition edges from the differentiated signal.

40. The signal isolator according to claim 39 further comprising:
the recovery circuit configured to recover the output information signal using positive feedback.

41. The signal isolator according to claim 39 further comprising:
the modulator configured to create the differential signals that contains all information in the logic signals in a single transition edge.

42. The signal isolator according to claim 39 further comprising:
a differential comparator comprising the modulator.

43. The signal isolator according to claim 39 further comprising:
a differential comparator coupled to a set/reset latch comprising the recovery circuit.

44. The signal isolator according to claim 39 further comprising:
a powered system on the input side of the isolation barrier and an isolated system on the output side of the isolation barrier.

45. The signal isolator according to claim 39 further comprising:
the differentiator configured as a current mode differentiator.

46. A signal isolator comprising:
an isolation barrier isolating first and second domains;
a modulator in the first domain coupled to the isolation barrier configured to convert an information signal to a digital signal that contains all information in the information signal in an edge of a single transition and passes the digital signal across the isolation barrier to the second domain;
a differentiator in the second domain coupled to the isolation barrier that differentiates the passed digital signal; and
a recovery circuit in the second domain coupled to the differentiator and configured to recover an output information signal from the differentiated digital signal based on the information in the single transition edge.

47. The signal isolator according to claim 46 further comprising:
a powered system in the first domain and an isolated system in the second domain.

48. A signal isolator comprising:
an isolation barrier isolating first and second domains;
at least one fully differential transmitter in the first domain coupled to the isolation barrier configured to transmit a digital signal containing all information in an information signal in an edge of a single transition across the isolation barrier to the second domain; and
at least one fully differential receiver in the second domain coupled to the isolation barrier configured to receive and differentiate the transmitted digital signal.

49. A signal isolator comprising:
an isolation barrier;
first and second separate dies from a common wafer comprising a transmitter on the first die and a receiver on the second die in a configuration that communicates an information signal across the isolation barrier as a digital signal that contains all information in a single transition edge; and
oscillators on the first and second dies that are matched to a selected tolerance.

50. The signal isolator according to claim 49 further comprising:
a state machine coupled to the receiver on the second die; and
a failsafe logic coupled to the state machine on the second die, the state machine and the failsafe logic configured to determine frequency of a signal transmitted across the isolation barrier, compare frequency of a local oscillator signal to the frequency of the transmitted signal, and correct transmitted state based on the comparison.

* * * * *